(12) United States Patent
Miura et al.

(10) Patent No.: US 7,384,678 B2
(45) Date of Patent: Jun. 10, 2008

(54) OPTICAL RECORDING MEDIUM AND PROCESS FOR PRODUCING THE SAME, SPUTTERING TARGET, USING PROCESS OF OPTICAL RECORDING MEDIUM, AND OPTICAL RECORDING APPARATUS

(75) Inventors: Hiroshi Miura, Yokohama (JP); Kazunori Ito, Yokohama (JP); Makoto Harigaya, Hiratsuka (JP); Eiko Hibino, Yokohama (JP); Masaru Shinkai, Yokohama (JP); Hiroko Ohkura, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/431,726

(22) Filed: May 10, 2006

(65) Prior Publication Data

US 2006/0269717 A1 Nov. 30, 2006

Related U.S. Application Data

(63) Continuation of application No. PCT/JP2004/016899, filed on Nov. 8, 2004.

(30) Foreign Application Priority Data

Nov. 10, 2003 (JP) .............................. 2003-380304
Jul. 7, 2004 (JP) .............................. 2004-201135
Oct. 25, 2004 (JP) .............................. 2004-310172

(51) Int. Cl.
*B32B 3/02* (2006.01)

(52) U.S. Cl. .................... 428/64.1; 428/64.4; 428/64.5; 428/64.6; 430/270.13

(58) Field of Classification Search ............... 428/64.5, 428/64.1, 64.4, 64.6; 430/270.13
See application file for complete search history.

(56) References Cited

U.S. PATENT DOCUMENTS 4,816,385 A 3/1989 Gravesteijn (Continued)

FOREIGN PATENT DOCUMENTS

EP 0184452 B1 6/1986

(Continued)

OTHER PUBLICATIONS

Kelly Daly Flynn and David Strand, (Feb. 2003), "InSbTe Phase-Change Materials for High Performance Multi-Level Recording", Jpn J. Appl., vol. 42, pp. 795-799.

*Primary Examiner*—Elizabeth Mulvaney
(74) *Attorney, Agent, or Firm*—Cooper & Dunham LLP

(57) ABSTRACT

To provide an optical recording medium and the like that is adapted to higher density and higher speed recording of 8 times or more than that of DVD (about 28 m/sec or more) and that exhibits superior repeating and reservation properties. An optical recording medium is provided that comprises a substrate, and a recording layer, wherein at least one of recording, reproducing, erasing, and rewriting of information is carried out by means of reversible phase changes at marks on the recording layer, the reversible phase changes at marks are induced between crystalline and amorphous states by laser irradiation, the length of the respective marks is 0.4 μm or less in the traveling direction of the laser irradiation, and the recording layer has a composition expressed by the formula: $In_\alpha Sb_\beta$, wherein $\alpha$ and $\beta$ are atomic percent of the respective elements; $0.73 \leq \beta/(\alpha+\beta) \leq 0.90$, $\alpha+\beta=100$, alternatively a composition expressed by the formula: $M_\gamma In_\alpha Sb_\beta$, wherein M represents an element other than In and Sb or an element combination containing two or more elements other than In and Sb; $\alpha$ and $\beta$ are atomic percent of the respective elements, $\gamma$ is atomic percent of the element or sum of atomic percent of the respective elements; $0.73 \leq \beta/(\alpha+\beta) \leq 0.90$, $0 < \gamma < \alpha$, $\alpha+\beta+\gamma=100$.

54 Claims, 14 Drawing Sheets

U.S. PATENT DOCUMENTS

| | | |
|---|---|---|
| 4,818,666 A | 4/1989 | Gravesteijn |
| 4,900,598 A * | 2/1990 | Suzuki ............... 428/64.6 |
| 4,947,372 A * | 8/1990 | Koshino et al. ......... 365/106 |
| 6,143,468 A | 11/2000 | Ohno et al. |
| 6,544,617 B1 | 4/2003 | Tyan et al. |
| 6,846,611 B2 * | 1/2005 | Yuzurihara et al. .... 430/270.13 |

FOREIGN PATENT DOCUMENTS

| | | |
|---|---|---|
| EP | 0239166 B1 | 5/1991 |
| EP | 0834874 A2 | 4/1998 |
| EP | 1283522 A1 | 2/2003 |
| EP | 1398778 A2 | 3/2004 |
| JP | 60-177446 | 9/1985 |
| JP | 61-134944 | 6/1986 |
| JP | 63-058632 | 3/1988 |
| JP | 63-263642 | 10/1988 |
| JP | 2-147384 | 6/1990 |
| JP | 3-52651 | 8/1991 |
| JP | 3-187785 | 8/1991 |
| JP | 4-1933 | 1/1992 |
| JP | 10-112028 | 4/1998 |
| JP | 2952287 | 7/1999 |
| JP | 2001-236690 | 8/2001 |
| JP | 2002-254816 | 9/2002 |
| JP | 2003-006859 | 1/2003 |
| JP | 2003-72244 | 3/2003 |
| JP | 2003-248967 | 9/2003 |
| JP | 2003-248973 | 9/2003 |

* cited by examiner

OPTICAL RECORDING MEDIUM AND PROCESS FOR PRODUCING THE SAME, SPUTTERING TARGET, USING PROCESS OF OPTICAL RECORDING MEDIUM, AND OPTICAL RECORDING APPARATUS

CROSS-REFERENCE TO RELATED APPLICATIONS

This is a continuation of Application No. PCT/JP2004/016899, filed on Nov. 8, 2004.

BACKGROUND OF THE INVENTION

1. Field of the Invention

The present invention relates to a optical recording medium capable of recording, reproducing, and rewriting information by irradiating laser to cause optical alternation on a material that constitutes a recording layer (hereinafter sometimes referring to as "phase change optical recording medium", "optical recording medium", "optical information recording medium" or "information recording medium"), a sputtering target for producing the optical recording medium, a process for using the recording medium, and an optical recording apparatus.

2. Description of Related Art

Recently, optical recording media are demanded to address recording with higher velocity. In case of disc optical recording media in particular, the higher velocity has been practically achieved on the grounds that raising the rotating velocity can increase the velocity of recording and reproducing. The recording media, on which the recording can be performed solely by modulation of optical intensity among others, may be commercially available in lower price owing to the simple recording mechanism. Also the reproducing mechanism based on the modulation of optical intensity affords effective interchangeability with reproducing-only apparatuses and makes possible the broad market; therefore, such optical recording media have been demanded the higher density and higher velocity recording owing to the recent extended capability of electric information.

Nowadays, the optical recording media, which employ phase change materials, are popular since plural times of rewriting are possible among others. The optical recording media, which employ phase change materials in the recording layer, perform through forming rapidly cooled and slowly cooled conditions by means of intensity modulation of the irradiated optical beams. In a rapidly cooled condition after melting, the material of recording layer turns into an amorphous state, whereas in a slowly cooled condition after melting, the material of recording layer turns into a crystal state. The optical properties are different between the amorphous and crystal conditions; thereby information may be recorded and reproduced.

The mechanism is that heating a recording layer through irradiating laser light on a thin film of the recording layer on a substrate, causing phase changes of the recording layer between the amorphous and crystal conditions, and repeatedly recording information by changing the disc reflectance. In many cases, the un-recorded condition corresponds to the crystal phase; information is recorded on the recording layer by forming marks of amorphous phase with lower reflectance and spaces of crystal phase with higher reflectance.

As well-known, recording light is arranged into pulses of which the intensity is modulated three levels, and the recording is performed through irradiating the recording light onto an optical recording medium. FIG. 6 exemplifies a pattern of emission waveform or recording strategy for repeatedly recording data of marks and spaces, which is employed in DVD+RW etc. The marks of amorphous state are formed by alternately irradiating peak power light (Pp=Pw) and bias power light (Pb) in pulse fashion; the spaces of crystal state are formed by continuously irradiating erase power light (Pe) that has an intermediate level of Pp and Pb.

Irradiating pulse arrays of peak power light and bias power light leads to formation of amorphous marks through the repeated melting and rapid cooling of the recording layer. Irradiating the erase power light leads to formation of spaces since the recording layer is melted then slowly cooled or is annealed in the solid state.

The formation of amorphous marks requires a melted state of the recording layer. In the higher velocity recording, higher power is required since the period of irradiating the peak power light is shortened. However, the power of laser diode (LD) is limited in the output power, resulting in inferior amorphous marks due to the insufficient output power. Accordingly, lower melting points are demanded for the materials of recording layer for higher velocity recording.

Various materials have been proposed heretofore with respect to the recording layer. The materials of recording layer in practice for CD-RW, DVD+RW, DVD-RW, DVD-RAM etc. can be broadly divided into Ag—In—Sb—Te family and Ge—Sb—Te family. The Ag—In—Sb—Te family is constituted by adding Ag and In into delta-phase solid solution of Sb—Te binary system that contains 63 to 83 atomic percent of Sb. On the other hand, Ge—Sb—Te family is constituted by blending two kinds of compounds, i.e. GeTe and $Sb_2Te_3$, in various ratio, represented by $Ge_2Sb_2Te_5$ that is constituted by blending $GeTe:Sb_2Te_3=2:1$. Both of the families have been improved through adding other elements etc. and have been applied for broad linear velocities.

For higher speed recording, the delta-phase of Sb—Te is advantageous in light of higher velocity of crystal growth, and lower melting point of the delta-phase of Sb—Te is also advantageous, i.e. its melting point is about 550° C., whereas that of pseudo-binary system of GeTe and $Sb_2Te_3$ is no less than 600° C.

In the family where various elements are added into the Sb—Te phase, in general, the crystallization rate may be increased and the recording layer may be applied to higher velocity recording by means of raising the composition ratio of Sb. One disadvantage of the Sb—Te delta-phase is the lower crystallization temperature such as 120° C. to 130° C., which requires that the crystallization temperature should be raised to 160° C. to 180° C. by additional elements such as Ag, In, and Ge to improve the stability of amorphous marks, thereby recording layers are to be produced that are adapted to higher velocity recording up to four times that of DVD.

However, in order to make adaptable to higher velocity recording of 8 times or more than that of DVD, the proportion of Sb should be increased thereby to raise the crystallization rate. In this concept, higher proportion of Sb tends to adversely effect the initialization, for example, reflectance nonuniformity is often induced after the initialization and noise level is exaggerated, as a result proper recordings cannot be performed at lower jitter. Further, the higher proportion of Sb inevitably leads to higher amount of additives since the crystallizing temperature further decreases; merely increasing the amount of additives often results in adverse effects on the initialization, the noise level is possibly exaggerated, as a result proper recordings cannot be performed at lower jitter. As such, in the family based on the Sb—Te delta-phase, it is difficult to produce recording layers that exhibit crystallization rate adapted to higher velocity recording of 8 times or more than that of DVD, provide easy initialization, and satisfy the preservation stability of amorphous marks.

In such backgrounds, Ga—Sb family, Ge—Sb family and the like are proposed that may exhibit higher crystallization rate and superior stability of amorphous marks for the purpose to replace the family based on the Sb—Te delta-phase. Materials of the Ga—Sb and Ge—Sb families show eutectic states at Sb-rich compositions such as above 80 atomic percent of Sb; the materials of Ga—Sb and Ge—Sb families may be employed as materials for higher velocity recording, by utilizing the respective eutectic compositions as the respective main compositions; and these materials may be enhanced the crystallization rate by raising the proportion of Sb, which is similar to the family based on the Sb—Te delta-phase. The crystallizing temperatures of these materials are as high as about 180° C., therefore the stability of the amorphous marks is superior without adding other elements. However, the higher eutectic temperatures such as about 590° C. than that of the family based on the Sb—Te delta-phase possibly result in the insufficient power at recording.

On the other hand, proposals as to optical recording media that employ a phase change recording layer based on In—Sb—Te, or In—Sb-M (M is an element other than In and Sb) may be seen, for example, in Japanese Patent Application Publication (JP-B) No. 3-52651, JP-B No. 4-1933, Japanese Patent (JP-B) No. 2952287, Japanese Patent Application Laid-Open (JP-A) No. 2001-236690, and "K. Daly-Flynn and D. Strand: Jpm. J. Appl. Phys. vol. 42 (2003) pp. 795-799".

JP-B No. 3-52651 discloses a recording material expressed by the general formula $(In_{1-x}Sb_x)_{1-y}M_y$ ($55 \leqq x \leqq 80$, $0 \leqq y \leqq 20$, M is at least one element selected from the group consisting of Au, Ag, Cu, Pd, Pt, Ti, Al, Si, Ge, Ga, Sn, Te, Se, and Bi); the recording is performed by making use of the reflectance difference between the pi-phase that is a pseudo-stable phase formed by cooling rapidly from a melting condition and a mixed phase or equivalent phase of InSb and Sb formed by cooling slowly from a melting condition. However, formation of the mixed phase or the equivalent phase typically takes a long period. Further, in the proposal, although writing and erasing are allegedly repeatedly capable through scanning laser with variable output, there is no description in terms of the scanning velocity of laser. Accordingly, the formation of equivalent layer is considerably difficult in a condition that the irradiating period at each site is no more than a few decades to a few hundreds nano seconds as that of DVD; therefore the proposal cannot be applied to phase change optical recording media such as CD-RW, DVD+RW, DVD-RW in advanced fashion. Moreover, the proposal is believed not to intend DVD in light of the technical level at the application i.e. 1984, the layer construction or recording way for forming fine amorphous marks of no more than 0.4 μm in length is not described, and needless to say, any disclosure or suggestion cannot be seen with respect to higher velocity recording of 8 times or more than that of DVD.

In the JP-B No. 4-1933, information is recorded and erased through selectively generating two stable conditions by irradiating optical energy with different conditions onto a recording thin film that is formed of fine alloy crystal containing 20 to 60 atomic percent of In and 40 to 80 atomic percent of Sb. One or more elements selected from Ag, In, Ge, Te and the like may be additionally included to the recording thin film in an amount of no more than 20 atomic percent. In the recording thin film of JP-B No. 4-1933, both of the stable conditions are of crystal state having different optical properties, which is allegedly derived from different depositions of $In_{50}Sb_{50}$ and Sb through the different heating and cooling steps; and the other factors are exemplified such as different size of crystal grain, shape alternation of thin film, generation of different crystal phase and the like. Provided that such factors cause an optical difference and the reflectance may be varied, the difference level of the reflectance is lower and C/N is remarkably lower than those based on phase change between crystal and amorphous being employed in the phase change recording media such as CD-RW, DVD+RW, and DVD-RW, consequently the materials are considered not to be practical.

In JP-B No. 2952287, recording is performed by means of recording material comprising 33 to 44 atomic percent of In or Ga, 51 to 62 atomic percent of Sb, and 2 to 9 atomic percent of Te by making use of phase changes between amorphous and crystal states; allegedly the signal intensity and amorphous stability are sufficient, and erasing can be performed at higher velocity. However, the intended linear velocity of recording is about 1 to 15 m/sec, that is, the crystallization rate is insufficient at higher velocity recording of 8 times (about 28 m/sec) or more than that of DVD, causing a problem that the incompletely erased amorphous marks remain.

The article "K. Daly-Flynn and D. Strand: Jpm. J. Appl. Phys. vol. 42 (2003) pp. 795-799" discloses recording materials expressed by the general formula $In_x(Sb_{72}Te_{28})_{100-x}$ (in which, x is 3.9 to 45 atomic percent) and recording by means of the material by making use of the phase changes between amorphous and crystal states. However, since the linear velocity of recording investigated in the article is about 2 m/sec to 6 m/sec, the crystallization rate is insufficient at higher velocity recording of 8 times (about 28 m/sec) or more than that of DVD, resulting in a problem that the incompletely erased amorphous marks remain.

In JP-A No. 2001-236690, CD-E media are proposed wherein alloy expressed by $M_w(Sb_xTe_{1-z})_{1-w}$ (in which, $0 \leqq w < 0.3$, $0.5 < z < 0.9$, M is at least one element selected from the group consisting of In, Ga, Zn, Ge, Sn, Si, Cu, Au, Ag, Pd, Pt, Cr, Co, O, S and Se) are employed in the recording layer of a thin film. However, this proposal is not intended the application of DVD, and any disclosure or suggestion cannot be seen with respect to higher velocity recording of 8 times or more than that of DVD (about 28 m/sec or more).

In the In—Sb family, higher proportion of Sb tends to bring about higher crystallization rate similarly to Sb—Te delta-phase, Ga—Sb, and Ge—Sb families. Accordingly, the Sb proportion higher than the compositions disclosed in JP-B No. 2952287 and "K. Daly-Flynn and D. Strand: Jpm. J. Appl. Phys. vol. 42 (2003) pp. 795-799" may lead to the crystallization rate sufficiently adaptable to higher velocity recording of 8 times or more than that of DVD. Also, the melting point of Sb-rich material is about 490° C. (measured by means of DSC the thin film formed by a sputtering process), which is similar to the eutectic temperature even when the Sb proportion is higher than that of eutectic composition. Also, the crystallizing temperature is as high as 180° C. to 200° C., the stability of amorphous marks are superior even without adding other elements.

However, the Sb proportion higher than the compositions disclosed in JP-B No. 2952287 and "K. Daly-Flynn and D.

Strand: Jpm. J. Appl. Phys. vol. 42 (2003) pp. 795-799" in In—Sb family leads to the disadvantage that the crystal stability is poor even though the amorphous stability is proper. FIGS. 7A and 7B explain the reflectance decrease at an un-recorded portion or crystal portion of $In_{35}Sb_{65}$, which is one of the In—Sb family and the composition is near the eutectic composition, after preservation test at 80° C. for 100 hours. FIG. 7A shows that of before the preservation test, and FIG. 7B shows that of after the preservation test. The results show the reflectance decrease of 18% to 29%, i.e. as much as 10% or more, indicating problems that the reflectance does not possibly satisfy the specs, the recording will be inferior since the recording under the condition with lowered reflectance leads to remarkably deteriorated jitter.

Further, JP-B No. 2952287 describes that "the recording element turns into unstable when the content of Q (In or Ga) is 34 atomic percent or less." The description is considered to mean the instability of crystal phase, and the family having lower In content than the content is considered not to be available for recording layers. However, it is found that the lower content of In or higher content of Sb makes possible to reduce the reflectance decrease after the preservation. Moreover, even when the reflectance decrease is relatively a little, the jitter may grow in the evaluation that the shelf property after preservation test is measured through recording in the same conditions with that of immediately after the initialization. Also, the material, of which reflectance decrease is reduced by increasing Sb content, causes some alternation in the crystal state at least in some degrees, there exists a problem that proper recording cannot be performed under the same conditions with those of immediately after the initialization.

Accordingly, the optical recording media and the related technologies adapted to higher velocity recording of 8 times or more than that of DVD (about 28 m/sec or more) based on recording layer materials that have lower melting point, higher crystallization velocity, and less reflectance nonuniformity after initialization, and exhibit superior crystal stability are not sufficiently satisfactory yet, therefore the provisions are demanded currently as advanced needs.

SUMMARY OF THE INVENTION

An object of the present invention is to provide an optical recording medium that is adapted to higher density and higher speed recording of 8 times or more than that of DVD (about 28 m/sec or more) and that exhibits superior repeating and reservation properties, and a sputtering target for producing the optical recording medium, a process for using the optical recording medium, and an optical recording apparatus.

Another object of the present invention is to provide an optical recording medium that is adapted to higher density and higher speed recording of 8 times or more than that of DVD (about 28 m/sec or more) based on recording layer materials that have lower melting point, higher crystallization velocity, and less reflectance nonuniformity after initialization, and exhibit superior crystal stability, and a sputtering target for producing the optical recording medium, a process for using the recording medium, and an optical recording apparatus.

In the investigations to attain the objects, the present inventors have found that excessively high melting point of recording layer materials may possibly lead to insufficient power at recording. Further, the materials having higher melting temperatures tend to exhibit some reflectance nonuniformity after the initialization, and is likely to increase the noise level after the initialization, resulting in inferior recording at lower jitter. The reason is not clear, but it is experienced that the reflectance nonuniformity could not be resolved by merely raising the power at initialization, which suggesting that lower melting points are advantageous.

In addition, in the further investigations concerning the materials of In—Sb family having a lower eutectic point of about 490° C. at 68 atomic percent of Sb, the present inventors experienced that the materials of In—Sb family may provide higher crystallization velocity, hardly occur reflectance nonuniformity, and exhibit superior stability of amorphous marks as the material of recording layer.

The present invention is introduced from such suggestions and experiences. The objects described above may be attained by the following manner.

The optical recording medium of the first aspect according to the present invention is such an optical recording medium that at least one of recording, reproducing, erasing, and rewriting of information is carried out by means of reversible phase changes at marks on the recording layer, the reversible phase changes are induced between crystalline and amorphous states by laser irradiation, the length of the respective marks is 0.4 µm or less in the traveling direction of the laser irradiation, and the recording layer has a composition expressed by the formula: $In_\alpha Sb_\beta$, wherein α and β are atomic percent of the respective elements; $0.73 \leq \beta/(\alpha+\beta) \leq 0.90$, $\alpha+\beta=100$.

In the first aspect of the inventive optical recording medium, the recording layer having the specific composition may bring about the optical recording media that exhibit superior preservation stability, and undergo repeated recordings and higher speed recording of 8 times or more than that of DVD (about 28 m/sec or more) while maintaining the capacity level similar to DVD-ROM.

The optical recording medium of the second aspect according to the present invention is such an optical recording medium that at least one of recording, reproducing, erasing, and rewriting of information is carried out by means of reversible phase changes at marks on the recording layer, the reversible phase changes are induced between crystalline and amorphous states by laser irradiation, the length of the respective marks is 0.4 µm or less in the traveling direction of the laser irradiation, and the recording layer has a composition expressed by the formula: $M_\gamma In_\alpha Sb_\beta$, wherein M represents an element other than In and Sb or an element combination containing two or more elements other than In and Sb; α and β are atomic percent of the respective elements, γ is atomic percent of the element or sum of atomic percent of the respective elements; $0.73 \leq \beta/(\alpha+\beta) \leq 0.90$, $0<\gamma<\alpha$, $\alpha+\beta+\gamma=100$.

In the second aspect of the inventive optical recording medium, the recording material of the recording layer having the specific composition may bring about lower melting point and higher crystallization rate, less reflectance nonuniformity after initialization, and superior stability of amorphous marks and crystal portions; these advantages may lead to the optical recording medium adapted to higher speed recording of 8 times or more than that of DVD (about 28 m/sec or more).

The sputtering target of the first aspect according to the present invention has a composition expressed by the formula: $In_\alpha Sb_\beta$, wherein α and β are atomic percent of the respective elements; $0.73 \leq \beta/(\alpha+\beta) \leq 0.90$, $\alpha+\beta=100$; and the sputtering target is applied for forming recording layers.

The sputtering target of the second aspect according to the present invention has a composition expressed by the formula: $M_\gamma In_\alpha Sb_\beta$, wherein M represents an element other than In and Sb or an element combination containing two or more elements other than In and Sb; α and β are atomic percent of the respective elements, γ is atomic percent of the element or sum of atomic percent of the respective elements; $0.73 \leq \beta/(\alpha+\beta) \leq 0.90$, $0<\gamma<\alpha$, $\alpha+\beta+\gamma=100$; and the sputtering target is applied for forming recording layers.

By applying the sputtering targets of the first and second aspects according to the present invention, a sputtering process and an alloy target of specific compositions may make possible to produce the intended composition of recording layers, which may lead to the optical recording medium adapted to higher speed recording of 8 times or more than that of DVD.

The inventive process for producing an optical recording medium may produce optical recording media comprising a first protective layer, a recording layer, a second protective layer, and a reflective on a substrate in one of this sequence and the opposite sequence; the process comprises forming a recording layer by means of a sputtering method using a sputtering target according to the present invention.

The inventive process for producing an optical recording medium may effectively produce optical recording media adapted to higher speed recording of 8 times or more than that of DVD.

The process for using an optical recording medium comprises conducting at least one of recording, reproducing, erasing, and rewriting of information by irradiating laser light onto the optical recording medium according to the present invention. Accordingly, the recording, reproducing, erasing, and rewriting information may be effectively performed with sufficient safety and assurance.

The inventive optical recording apparatus performs at least one of recording, reproducing, erasing, and rewriting of information through irradiating light onto an optical recording medium, wherein the optical recording medium is one according to the present invention. Accordingly, the recording, reproducing, erasing, and rewriting of information may be effectively performed with sufficient safety and assurance.

Figure 1:
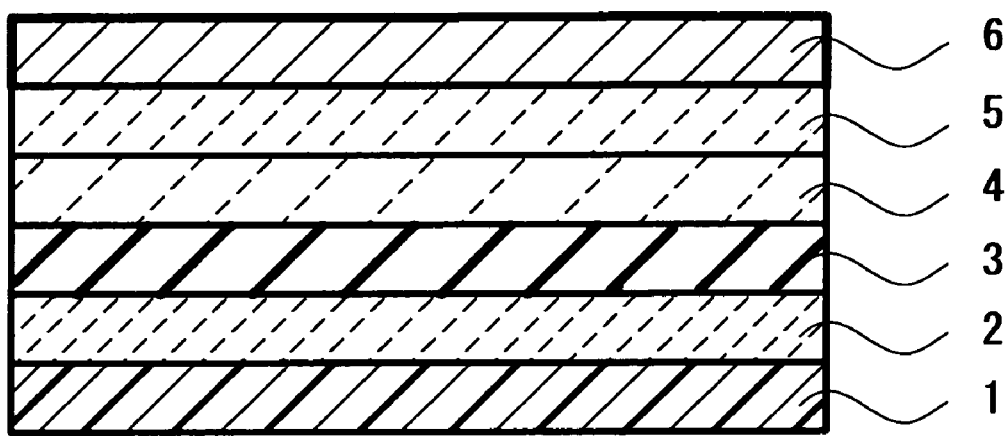
FIG. 1 schematically shows an exemplary layer construction of an optical recording medium according to the present invention.

DESCRIPTION OF THE PREFERRED EMBODIMENTS (Optical Recording Medium)

The optical recording medium according to the present invention comprises a substrate and a recording layer, wherein at least one of recording, reproducing, erasing, and rewriting of information is carried out by means of reversible phase changes at marks on the recording layer, the reversible phase changes are induced between crystalline and amorphous states by laser irradiation, the length of the respective marks is 0.4 μm or less in the traveling direction of the laser irradiation.

In the first aspect of the present invention, the recording layer has a composition expressed by the formula: $In_\alpha Sb_\beta$, wherein α and β are atomic percent of the respective elements; $0.73 \leq \beta/(\alpha+\beta) \leq 0.90$, $\alpha+\beta=100$.

In the second aspect of the present invention, the recording layer has a composition expressed by the formula: $M_\gamma In_\alpha Sb_\beta$, wherein M represents an element other than In and Sb or an element combination containing two or more elements other than In and Sb; $\alpha$ and $\beta$ are atomic percent of the respective elements, $\gamma$ is atomic percent of the element or sum of atomic percent of the respective elements; $0.73 \leq \beta/(\alpha+\beta) \leq 0.90$, $0<\gamma<\alpha$, $\alpha+\beta+\gamma=100$.

Preferably, the optical recording medium according to the present invention comprises a substrate, and a first protective layer, a recording layer, a second protective layer, and a reflective layer on the substrate in one of this sequence and the opposite sequence; laser light is irradiated from the side of the first protect layer thereby to cause reversible phase changes of the recording layer, thus at least one of recording, reproducing, erasing, and rewriting of information is carried out by making use of the optical changes.

The recording layer of the first aspect has a composition expressed by the formula: $In_\alpha Sb_\beta$, wherein $\alpha$ and $\beta$ are atomic percent of the respective elements, $0.73 \leq \beta/(\alpha+\beta) \leq 0.90$, $\alpha+\beta=100$. The materials of In—Sb family having the composition of higher crystallization rate as well as higher recording sensitivity, therefore may afford appropriate recording properties with higher linear velocity.

The In—Sb family has a eutectic composition at around $In_{32}Sb_{68}$. It is found that as $\beta/(\alpha+\beta)$ comes to higher from the eutectic composition, the crystallization rate increases. $\beta/(\alpha+\beta)$ is defined in the present invention as $0.73 \leq \beta/(\alpha+\beta) \leq 0.90$, preferably $0.80 \leq \beta/(\alpha+\beta) \leq 0.90$. When $\beta/(\alpha+\beta)$ is less than 0.73, the overwriting is likely to be difficult under 8 times or more of linear velocity due to insufficient crystallization rate. When $\beta/(\alpha+\beta)$ is above 0.90, the stability of amorphous may be deteriorated, possibly resulting in the decrease of preservation reliability in terms of recorded data. When $\beta/(\alpha+\beta)$ is less than 0.80, there may exist some allowance in crystallization rate, which brings about a degree of margin in designing the media. For example, the layer thickness of the recording layer and the materials or layer thickness of other layers may be decided with margin in constructing optical recording media.

The recording layer of the second aspect has a composition expressed by the formula: $M_\gamma In_\alpha Sb_\beta$, wherein M represents an element other than In and Sb or an element combination containing two or more elements other than In and Sb; $\alpha$ and $\beta$ are atomic percent of the respective elements, $\gamma$ is atomic percent of the element or sum of atomic percent of the respective elements; $0.73 \leq \beta/(\alpha+\beta) \leq 0.90$, $0<\gamma<\alpha$, $\alpha+\beta+\gamma=100$.

Figure 19:
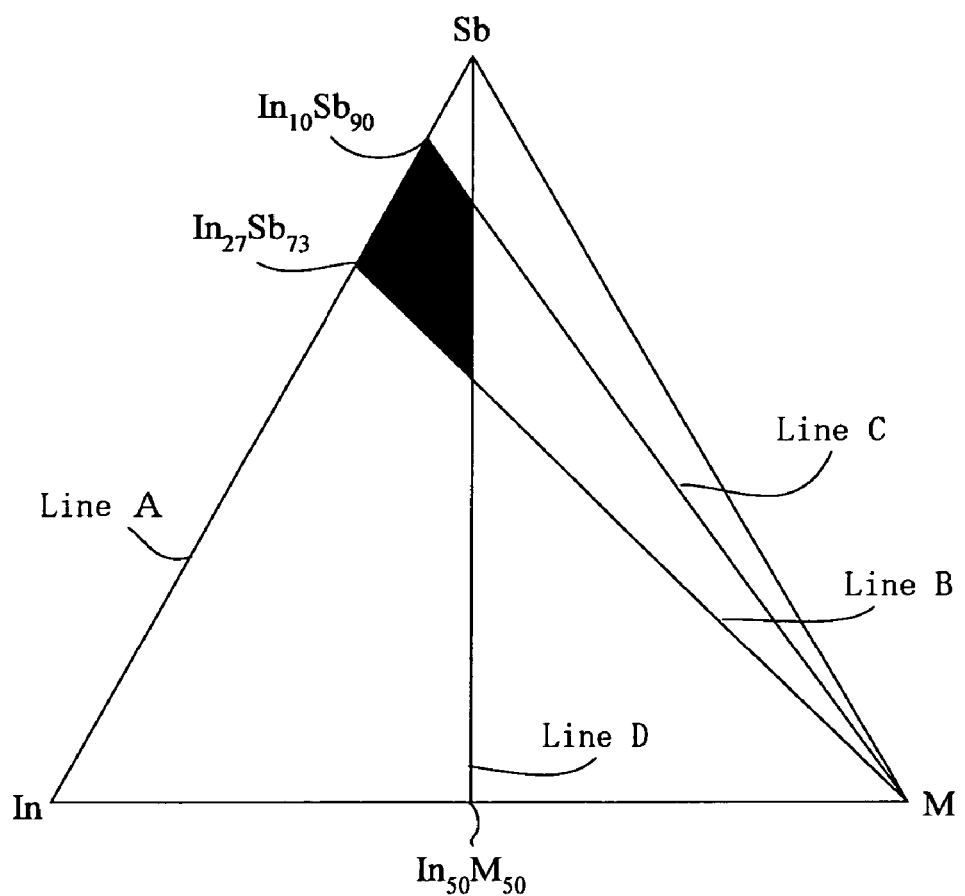
FIG. 19 is a graph that exemplarily shows the range that satisfies the inventive composition of In—Sb-M.

The range that satisfies the above condition as to the In—Sb-M family containing three elements is shown in FIG. 19. The range is the marked area surrounded by four straight lines of A, B, C and D, excluding the area on the lines A and D.

Figure 9:
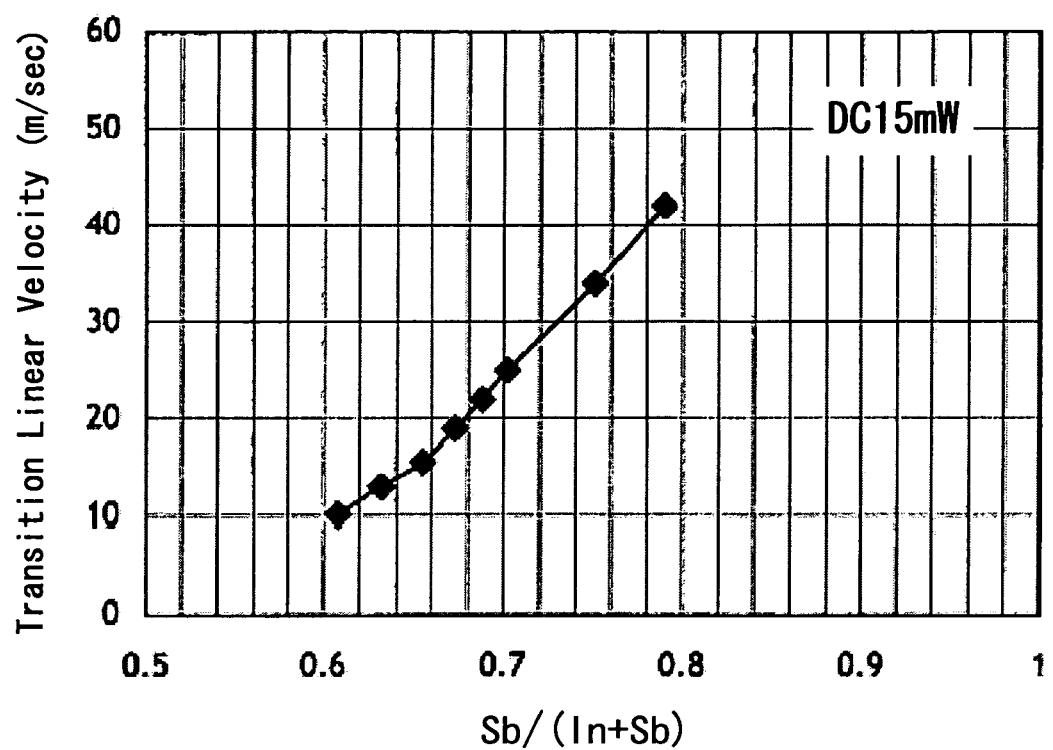
FIG. 9 is a graph that exemplarily explains transition linear velocity in relation to the composition of In—Sb family.

FIG. 9 is a graph that explains transition linear velocity in relation to the composition of In—Sb family. The "transition linear velocity" is a substitute property of crystallization rate; the higher transition linear velocity corresponds to the higher crystallization rate.

Figure 10A:
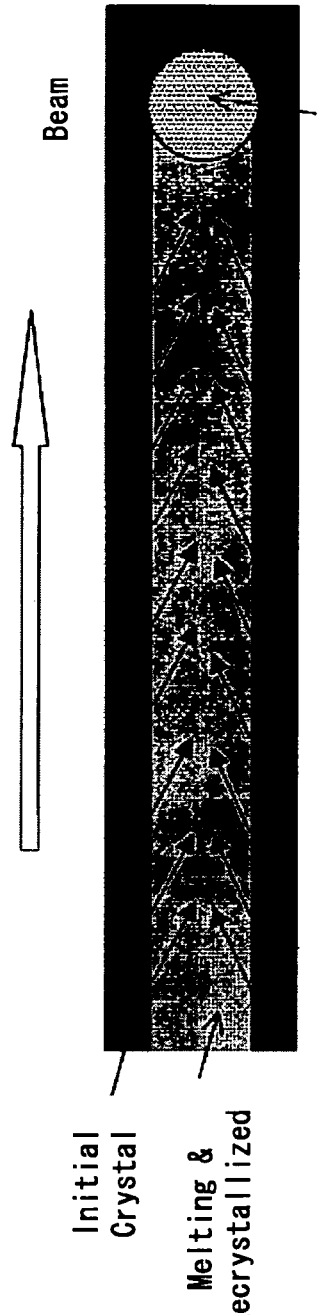
FIG. 10A is a view that exemplarily explains transition linear velocity, showing a condition of entire recrystallization after melting.
Figure 10B:
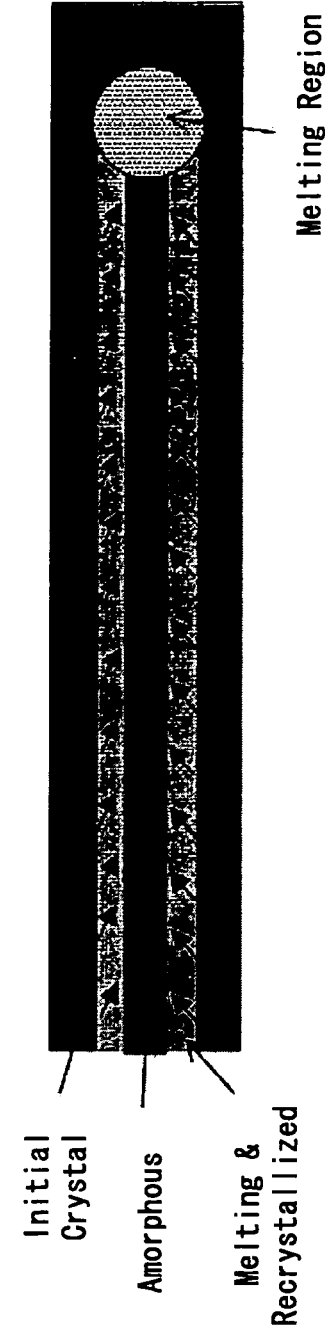
FIG. 10B is a view that exemplarily explains transition linear velocity, showing a condition that amorphous state is formed after melting rather than entire recrystallization.

For determining the transition linear velocity, a conventional test device for recording and reproducing may be utilized, an optical recording medium is rotated at a constant linear velocity, and the reflectance is measured after irradiating laser light so as to possibly melt the recording layer. The melted recording layer crystallizes again from the boundary with the surrounding crystal state as shown in FIGS. 10A and 10B. Slower linear velocity leads to a slowly cooled condition, thus resulting in higher reflectance due to entire recrystallization as shown in FIG. 10A. Higher linear velocity leads to a rapidly cooled condition, thus bringing about insufficient recrystallization to the center portion as shown in FIG. 10B, amorphous state is formed partially, and the reflectance is decreased. The linear velocity from which the decrease of reflectance appears is referred to as "transition linear velocity." As such, the higher is the crystallization rate of the recording layer, the higher is the recrystallization rate, and the higher is the transition linear velocity, since more rapid cooling result in entire recrystallization.

The transition linear velocity, being variable depending on the laser power and layer construction of the medium, does not absolutely define the recordable linear velocity, but is a convenient measure to determine the recordable linear velocity. The values in terms of transition linear velocity shown in FIG. 9 are determined by irradiating continuous light onto a recording medium at 15 mW as disc face power using a pickup head of 660 nm in wavelength and NA=0.65, wherein the recording medium is prepared by laminating ZnS—$SiO_2$ in 81 nm thick, In—Sb as the recording layer in 16 nm thick, ZnS—$SiO_2$ in 14 nm thick, SiC in 4 nm thick, and Ag in 140 nm thick in turn by means of a sputtering process, then initially crystallizing by an LD having a larger aperture. In order to perform repeated recordings at a speed of 8 times or more than that of DVD, the value of transition linear velocity determined by this way is required to be 25 m/sec or more. Accordingly, the mole ratio of Sb to In—Sb i.e. $\beta/(\alpha+\beta)$ should be 0.73 or more, preferably is 0.8 or more. When $\beta/(\alpha+\beta)$ is less than 0.73, incompletely erased amorphous marks may remain during the repeated recordings at a speed of 8 times or more than that of DVD since the crystallization rate is slower.

As for the recording media of which $\beta/(\alpha+\beta)$ is above 0.8, the transition linear velocity is too rapid to be easily determined, while the recording is possible since the formation of amorphous marks can be confirmed by irradiating laser light in a pulse fashion. However, when $\beta/(\alpha+\beta)$ is more than 0.90, the crystallizing temperature decreases promptly and the stability of amorphous marks is deteriorated. It is confirmed that the amorphous marks partially crystallize and the reflectance of mark portion comes to higher than the initial state in the preservation test. If an element is added to raise the crystallization rate so as to prevent such a problem, other problems arises such as reflectance nonuniformity at initialization, resulting in inferior recordings. As such, $\beta/(\alpha+\beta)$ should be 0.90 or less, preferably is 0.85 or less.

The recording layer of the second aspect according to the present can address such a matter that the preservation stability of amorphous and crystal states is poor in two components of In—Sb family; and archival property i.e. preservation reliability of recorded data, and shelf property i.e. recording property of fresh data after preservation are likely to turn into poor. In the second aspect according to the present, at least one element selected from the group consisting of Ge, Te, O, S, Se, Al, Ag, Mn, Cu, Au, and N is added to In—Sb having the composition described above.

The addition of Ge mainly leads to an effect to stabilize the amorphous phase, thus the archival property can be enhanced. The content of Ge is preferably 0.2 atomic percent or more, more preferably is 1.0 atomic percent or more; in addition, preferably is 15 atomic percent or less, more preferably is 10 atomic percent or less, most preferably is 4.0 atomic percent or less. Excessively much amount results in lower crystallization rate.

The addition of at least one element selected from the group consisting of O, S, Se, and Te of sixteen group in Periodic Table mainly leads to an effect to stabilize the crystal phase, thus the shelf property can be enhanced. These are based on the investigations that suggest the effect of the elements to prevent the reflectance decrease. The addition of Te in particular may bring about proper results in repeated recording properties.

Figure 11:
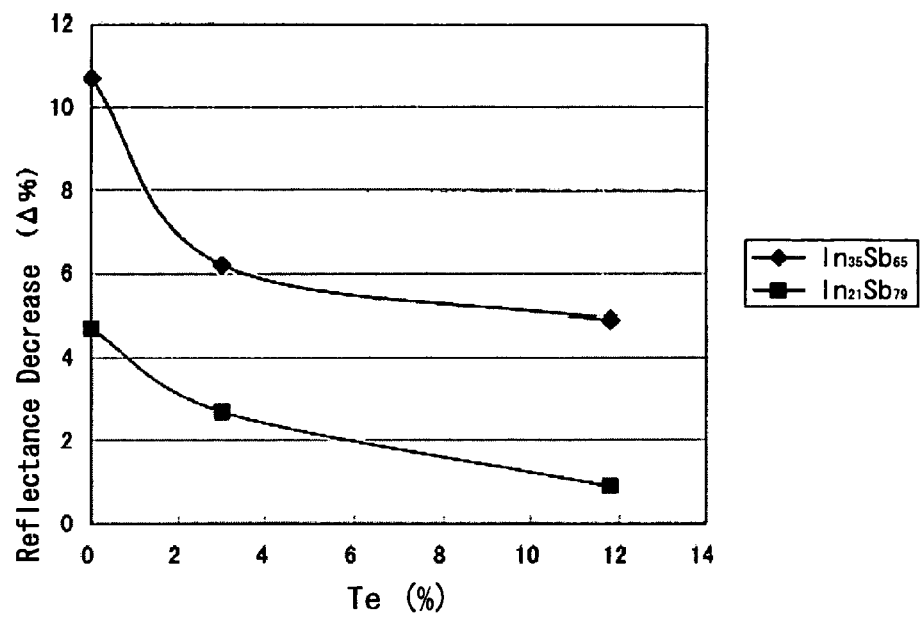
FIG. 11 is a graph that exemplarily explains reflectance decrease, with respect to a series of Te adding to In—Sb after preservation at 80° C. for 100 hours.

FIG. 11 a graph that explains reflectance decrease after preservation at 80° C. for 100 hours with respect to a series of Te-addition. Two cases of $In_{35}Sb_{65}$ and $In_{21}Sb_{79}$ are shown in terms of the addition of Te. Both of the cases show the effect to reduce the reflectance decrease by the addition of Te. From the evaluation of the shelf property whether or not recording is possible on the un-recorded portion after the preservation test, the deterioration of the shelf property is almost non-detectable in the Te-addition materials.

In order to achieve the effect on stabilization of crystal phase such as reduction of reflectance decrease, the content of added Te is at least 1 atomic percent, preferably 2.5 atomic percent or more. Higher content of Te results in more significant effect on stabilization of crystal phase, while the crystallization rate turns into lower. In order to attain the sufficient crystallization rate for repeated recordings at the velocity of 8 times or more than that of DVD, the content of Te is at most 15 atomic percent, preferably 12 atomic percent or less.

Figure 20:
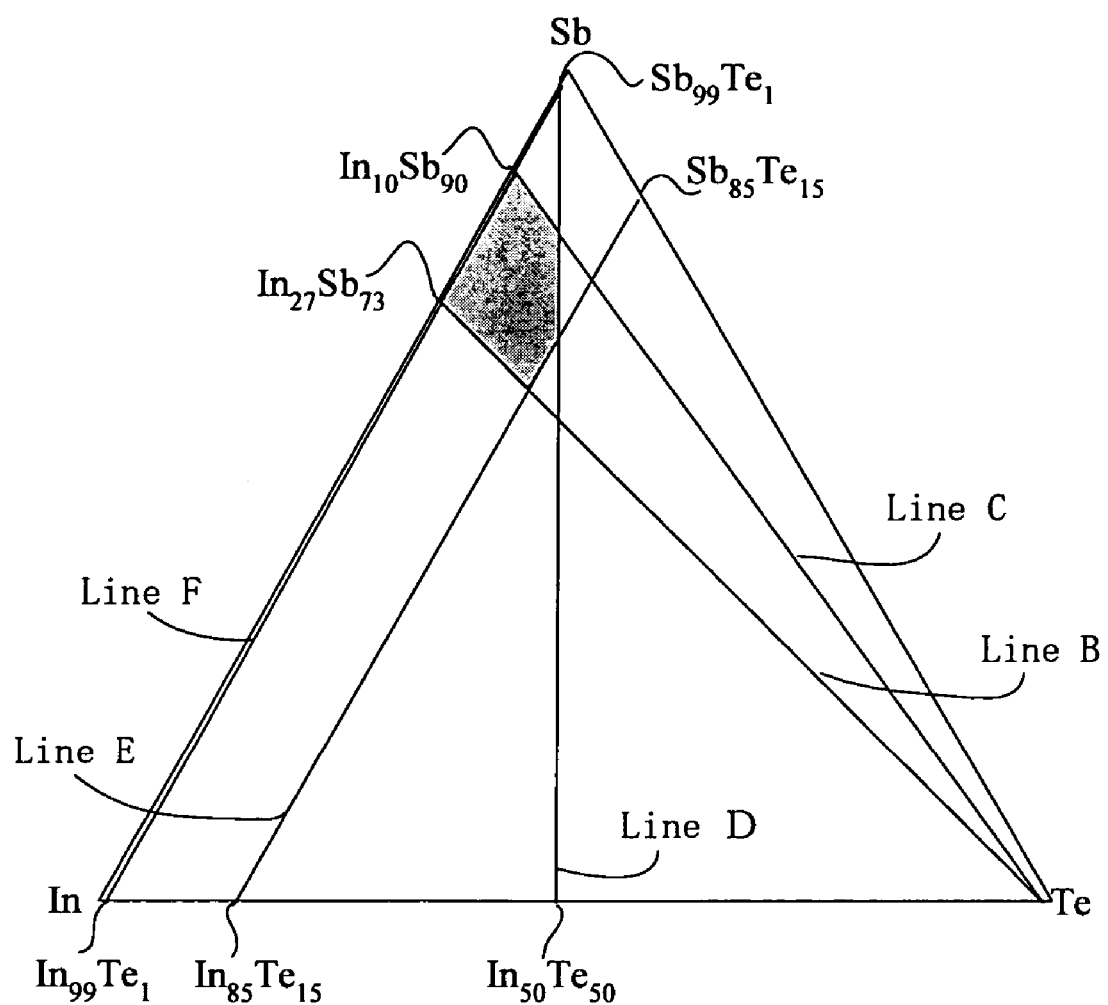
FIG. 20 is a graph that exemplarily shows the range that satisfies the inventive composition of In—Sb—Te.

The range that satisfies the above conditions as to the In—Sb—Te family of three elements is the marked range surrounded by five straight lines of B, C, D, E and F as shown in FIG. 20, excluding the area on the line D.

The addition of Ag, Au, Cu, or N may provide effects to enhance the recording sensitivity, thus enabling the recordings at lower power. The content of Ag, Au, Cu, or N is 0.2 atomic percent or more, preferably is 0.5 atomic percent or more; in addition, preferably is 5.0 atomic percent or less, more preferably is 4.0 atomic percent or less. Excessively much amount of Ag, Au results in lower crystallization rate and deterioration of amorphous stability.

The addition of Al or Mn may mainly provide effects to stabilize the amorphous state, thus improving the archival property. The effect of Al or Mn is similar to that of Ge, while the effect on the archival property is less than that of Ge at the same content as well as the effect to lower the crystallization rate is lower than that of Ge. Accordingly, the adverse effect on the repeated recording property at higher velocity is not significant even the content is higher than Ge. The effect to stabilize the amorphous state is attained at the Al or Mn content of 1.0 atomic percent or more, preferably is 2.0 atomic percent or more; in addition, preferably is 15 atomic percent or less, more preferably is 12 atomic percent. Such content of Al or Mn may leads to recordings at the velocity of 8 times or more than that of DVD.

In the second aspect of the present invention, the content of In and M in the recording layer is defined as $0<\gamma<\alpha$, i.e. the content of M is less than the content of In. The recording layer with higher content of M than the content of In causes a change of main phase from In—Sb to Sb-M of which the melting point is high such as 592° C. in case of M being Ge, 550° C. in case of M being Te for example, resulting in the occurrences of insufficient LD power at higher velocity recording and reflectance nonuniformity at initialization.

The additive element M may be added alone or in combination depending on the application.

Preferably, the recording layer is crystallized at 150° C. to 250° C. in a rate of temperature increase of 10° C./minute, more preferably 160° C. to 220° C. In the temperature range of crystallization, the stability of amorphous marks may be assured, and also sufficient preservation reliability may be assured.

As for the process for forming the recording layer, various vapor growth processes may be employed such as vacuum deposition, sputtering, plasma CVD, optical CVD, ion plating, electron beam deposition processes and the like. Among these, sputtering process is appropriate in the mass production, film quality and the like.

The thickness of the recording layer may be properly selected without particular limitation, preferably is 8 nm to 22 nm, and more preferably is 10 nm to 18 nm. When the thickness is out of the range, such problems may be induced as reduction of the recording sensitivity and decrease of repeatable property.

Preferably, a boundary layer containing an oxide is disposed between the recording layer and the first protective layer or between the recording layer and the second protective layer, thereby a high speed overwrite property may be achieved.

The materials of In—Sb family exhibit higher crystallization rate and higher recording sensitivity, therefore display higher recording liner velocity. However, it is difficult that all of high-speed overwrite, modulation level, reservation reliability, and initialization matter are satisfactorily achieved. In particular, it is difficult to overwrite in a higher speed.

In order to enhance the durability on repeated recordings, the phase changes between amorphous and crystal states should be promptly performed repeatedly. When the jitter increases due to the repeated recordings, a phenomenon appears that the reflectance decreases between marks and at shorter marks. The reason of the phenomenon is considered that the erasing i.e. crystallization is improper during the repeated recordings; specifically, portions of lower reflectance that do not return to the initial crystalline condition are accumulated. In the constitution of the present invention, the reflectance decrease does not appear between marks and at shorter marks, thus the increase of jitter may be prevented even after the repeated recordings. The reason is considered that the boundary layer of oxide provides an effect to promote nucleus formation, and enhance the crystallization at lower temperature.

Figure 2:
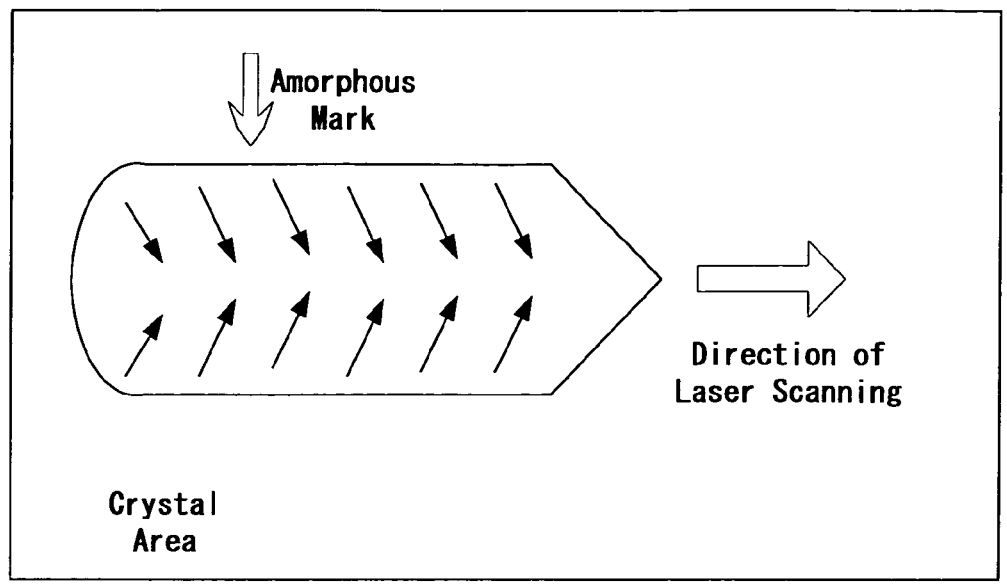
FIG. 2 schematically shows an exemplary view illustrating a crystallizing process when laser light is irradiated onto an amorphous mark on a recording layer of an optical recording medium.

The crystallization proceeds through the formation of crystal nuclei and crystal growth. FIG. 2 schematically shows a view illustrating that laser light is irradiated onto an amorphous mark, crystal growth progresses from the boundary with crystal portions, and crystallization expands.

Figure 3:
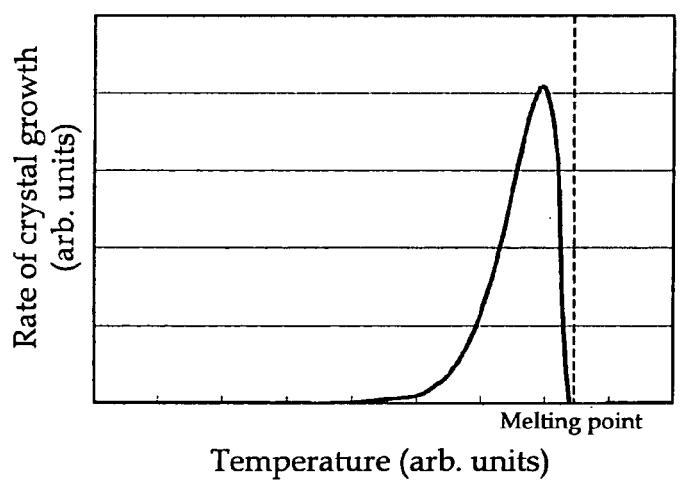
FIG. 3 is an exemplary view that summarily explains the relation between recording layer temperatures and crystallization rate.

FIG. 3 schematically shows the relation between recording layer temperatures and crystal growth rates. As shown in FIG. 3, the high-speed crystallization proceeds in a specific temperature range around the melting point. Accordingly, when the end of mark does not arise to the temperature where the crystal growth proceeds rapidly, the incompletely erased amorphous marks remain due to lower speed of crystal growth. When the area, where the temperature reaches the level that crystal growth proceeds rapidly, is sufficiently large compared with the mark width, the crystallization will proceed rapidly from the end of mark when laser beam is irradiated. When the area is comparative with the mark width, all of the mark ends may not reach the temperature at which crystal growth proceeds rapidly, for example, in the case that the width of the mark is nonuniform and a part of the mark is relatively wide, and that the tracking of the recording beam is somewhat shifted, as a result, incompletely erased marks may appear.

When a boundary layer of oxide is provided so as to contact with the recording layer, crystal nuclei yields inside the marks even the temperature at the mark ends is relatively lower and the crystal growth rate is not so rapid, the crystallization proceeds due to the crystal growth from the crystal nuclei, therefore, the durability in repeated recording is considered to be enhanced.

The oxide at the boundary layer is preferably at least one selected from $ZrO_2$, $TiO_2$, $SiO_2$, $Al_2O_3$, $Ta_2O_5$, $Y_2O_3$, MgO, CaO, $Nb_2O_5$, and rare earth oxides. Among these, the oxides including $ZrO_2$, $TiO_2$, $SiO_2$, $Al_2O_3$, $Ta_2O_5$, and mixture thereof as the main component are preferable; still more preferably, one or more of $Y_2O_3$, MgO, CaO, $Nb_2O_5$, and rare earth oxides are additionally included thereto. The term "main component" refers to the component that occupies 40 mol % or more of the oxide.

The thickness of the boundary layer is preferably 1 nm to 20 nm. When it is below 1 nm, the effect is not significant, when it is above 20 nm, the overwrite property may comes to lower.

Preferably, a crystallization-promoting layer is provided that contacts with at least a part of the recording layer on a condition that the recording material of the recording layer is In—Sb material.

In—Sb materials exhibit higher crystallization rate and also higher recording sensitivity, thus provide properly high linear recording properties. However, it is difficult that all of high-speed overwrite, modulation level, reservation reliability, and initialization matter are satisfactorily achieved; in particular, reservation reliability is not sufficient, i.e. decrease in reflectance occurs due to crystalline condition during preservation test.

The crystallization-promoting layer, usually formed by a sputtering method, contains a number of crystal nuclei in the resulting layer.

Therefore, the crystallization-promoting layer performs to decrease the crystallization energy of the alloy that constitute the recording layer, and to facilitate the crystallization of the recording layer.

The reason is not necessarily clear why the reflectance decreases by providing the crystallization-promoting layer; but it is estimated that facilitating the crystallization of the recording layer leads to the formation of stable crystals in the recording layer at the initial stage, and the stability is continued to the crystal condition after the recording.

In addition, the recording layer formed in an amorphous state, which contacts with at least a part of the crystallization-promoting layer, may be crystallized already after the layer is formed in some cases. In such cases, the recording layer may be recorded without so-called initialization step, e.g. heating step by irradiating laser in general, which is conducted to crystallize the recording layer at the final stage for producing optical recording media. If the recording layer is not crystallized yet after the recording layer is formed, the following initialization step may be facilitated by the crystal nuclei formed in the step to produce the recording layer.

The initialization step is preferably carried out by laser-annealing crystallization in which semiconductor laser beam is irradiated and shifted in the radius direction of a disc while rotating the disc.

The crystallization-promoting layer preferably comprises one of Bi, Sb, Te, and In, in particular at least one of Bi and Sb. These elements may be of multi-element metallic compound, alloy, or mixture.

The reason is not necessarily clear why the material performs as the crystallization-promoting layer; but it is considered that long-period elements tend to have a longer atomic radius and metallic property, which promote the formation of crystal nuclei in the step of producing the layer.

In the present invention, the crystallization-promoting layer may be disposed on the entire or a partial surface of the recording layer. If the crystallization-promoting layer does not contact with the recording layer at all due to existence of another layer between the crystallization-promoting layer and the recording layer, another layer may perform as a crystallization-promoting layer provided that another layer is crystallized.

The crystallization-promoting layer may be provided between the first protective layer and the recording layer, between the second protective layer and the recording layer, or both of the sites. Preferably, the crystallization-promoting layer is provided between the first protective layer and the recording layer from the viewpoint of effective crystallization promoting and higher throughput. The crystallization-promoting layer may be a continuous film or island-like discontinuous film, both of them may afford a desired crystallization-promoting effect. The crystallization-promoting layer may be formed by vacuum deposition process such as sputtering, vapor deposition and the like.

Preferably, the thickness of the crystallization-promoting layer is more than $1/100$ of the thickness of the recording layer, more preferably is more than $1/50$, and still more preferably is more than $1/25$.

Preferably, the thickness of the crystallization-promoting layer is 0.2 nm to 10 nm, more preferably is 0.5 nm to 2 nm. When it is below 0.2 nm, the effect of crystallization promoting is not significant, when it is above 10 nm, the overwrite property may comes to lower.

The layer constitution of the optical recording medium according to the present invention will be explained in the following with reference to Figures.

FIG. 1 is an exemplary cross section that shows the constitution of one aspect of the inventive optical recording medium. The first protective layer 2, the recording layer 3, the second protective layer 4, the third protective layer 5, and the reflective layer 6 are disposed on the substrate 1 in this order. If necessary, another protective layer of UV-ray curable resin may be formed on the reflective layer by means spin coating method. In addition, another substrate may be laminated to the protective layer for further reinforcing or protecting the optical recording medium if necessary.

Figure 4:
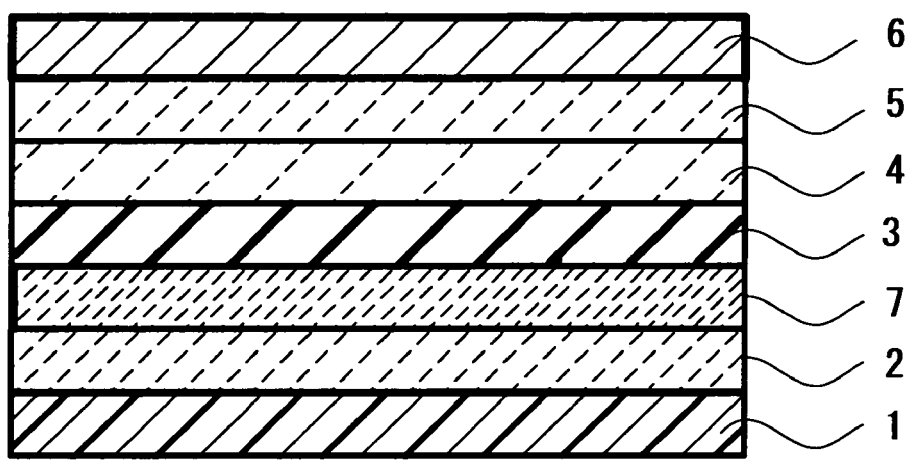
FIG. 4 schematically shows another exemplary layer construction of an optical recording medium according to the present invention.

FIG. 4 is another exemplary cross section that shows the constitution of another aspect of the inventive optical recording medium. The first protective layer 2, the boundary layer 7, the recording layer 3, the second protective layer 4, the third protective layer 5, and the reflective layer 6 are disposed on the substrate 1 in this order. By the way, the third protective layer 5 is not absolutely necessary.

Figure 5:
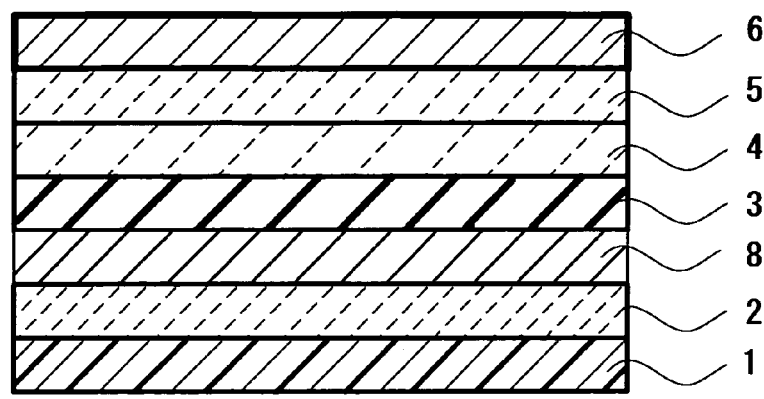
FIG. 5 schematically shows still another exemplary layer construction of an optical recording medium according to the present invention.
Figure 6:
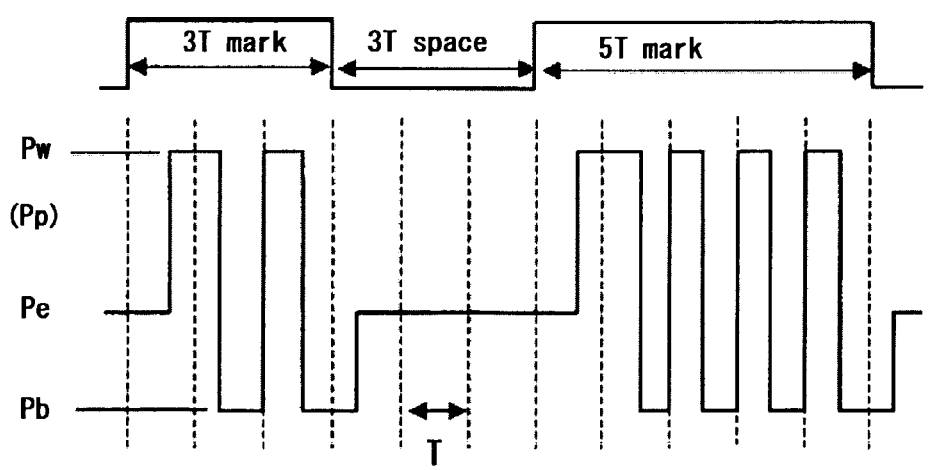
FIG. 6 schematically shows an emission pattern of waveform or recording strategy employed in DVD+RW etc.
Figure 7A:
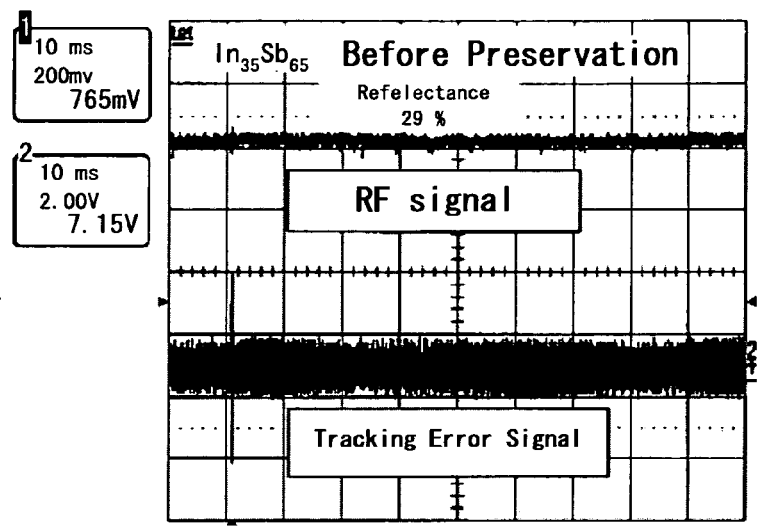
FIG. 7A is a graph that exemplarily explains reflectance decrease, with respect to a composition near the eutectic point of In—Sb family, at an un-recorded portion or crystal portion before a preservation test.
Figure 7B:
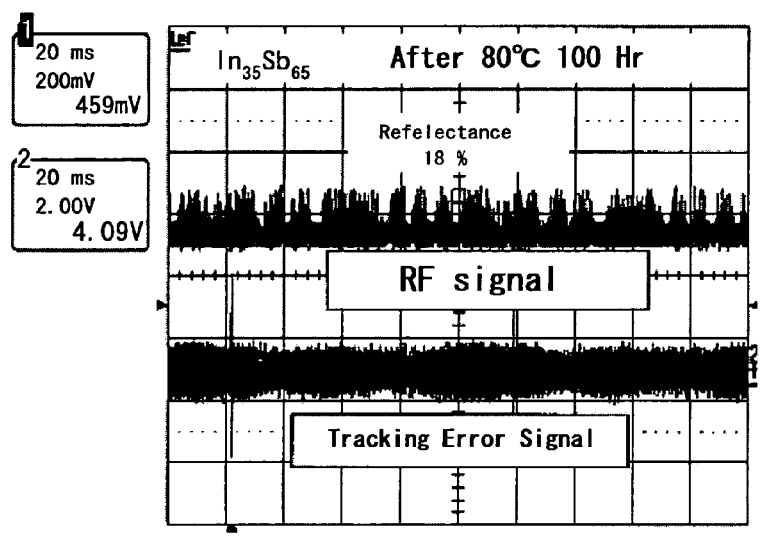
FIG. 7B is a graph that exemplarily explains reflectance decrease, with respect to a composition near the eutectic point of In—Sb family, at an un-recorded portion or crystal portion after a preservation test at 80° C. for 100 hours.
Figure 8:
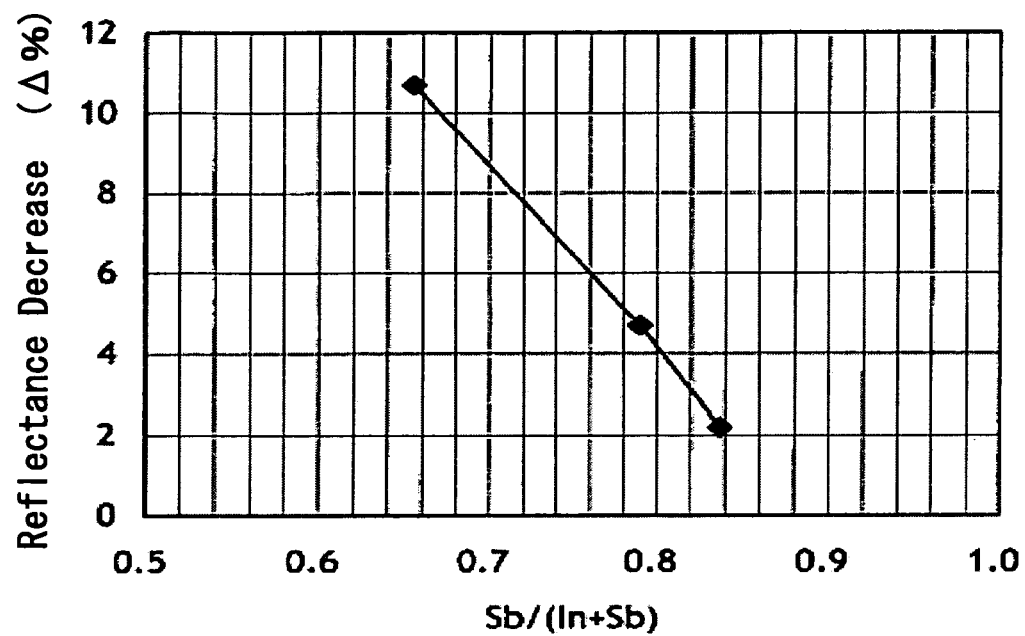
FIG. 8 is a graph that exemplarily explains reflectance decrease with respect to In—Sb family when the content of In is decreased.

FIG. 5 is another exemplary cross section that shows the constitution of another aspect of the inventive optical recording medium. The first protective layer 2, the crystallization-promoting layer 8, the recording layer 3, the second protective layer 4, the third protective layer 5, and the reflective layer 6 are disposed on the substrate 1 in this order. Similarly, the third protective layer 5 is not absolutely necessary.

The respective layers of the inventive optical recording medium will be explained in the following. The recording layer, boundary layer, and the crystallization-promoting layer are explained above.

—Substrate—

As for the substrate, for example, a polycarbonate resin substrate is preferable that is formed grooves on the surface for tracking, that is of disc shape of 12 cm in diameter and 0.6 mm in thickness, and that is superior in processing and optical properties. The guide grooves for tracking are of meander shape having 0.74±0.03 μm in pitch, 22 nm to 40 nm in groove depth, and 0.2 μm to 0.4 μm in width. The deeper groove may lead to lower reflectance of the optical recording medium and larger modulation level.

As for the material of the substrate, usually, glass, ceramics, and resin are employed. Preferably, resin is employed from the viewpoint of moldability and economy. As for the resin, for example, polycarbonate resin, acryl resin, epoxy resin, polystyrene resin, acrylonitrile-styrene copolymer resin, polyethylene resin, polypropylene resin, silicone resin, fluoride resin, ABS resin, urethane resin and the like may be exemplified. Among these, polycarbonate resin and acryl resin are preferable from the viewpoint of moldability, economy, and optical property.

—First Protective Layer and Second Protective Layer—

The first protective layer 2 and the second protective layer 4 perform to prevent the degeneration or deterioration of the recording layer 3, and also to enhance the adhesive strength and recording property of the recording layer 3. These protective layers are formed from, for example, metal oxide such as SiO, $SiO_2$, ZnO, $SnO_2$, $Al_2O_3$, $TiO_2$, $In_2O_3$, MgO, $ZrO_2$, and the like, nitride such as $Si_3N_4$, AlN, TiN, BN, ZrN and the like, sulfide such as ZnS, $In_2S_3$, $TaS_4$, and the like, carbide such as SiC, TaC, $B_4C$, WC, TiC, ZrC, and the like, diamond, and mixtures thereof. Among these, mixtures of ZnS and $SiO_2$, $Ta_2O_5$ and SiO are preferable. The mixture of ZnS and $SiO_2$ is superior in thermal resistance, lower thermal conductivity, and chemical resistance. Also the mixture shows lower residual stress of film, is likely to maintain the properties such as recording sensitivity and erasing ratio even after the repeated recording and erasing, and exhibits excellent adhesion with the recording layer.

The second protective layer performs to confine and accumulate the heat applied to the recording layer through irradiating laser light, and also performs to dissipate the heat by transferring to the reflective layer, as such mainly determines the repeated overwrite property. From these viewpoints, the mixture of ZnS and $SiO_2$ is preferable.

As for the process for forming the first protective layer 2 and the second protective layer 4, various vapor growth processes may be employed such as vacuum deposition, sputtering, plasma CVD, optical CVD, ion plating, electron beam deposition processes and the like. Among these, sputtering process is appropriate in mass production, film quality and the like.

The thickness of the first protective layer 2 may be properly selected depending on the application; preferably is 50 nm to 250 nm, more preferably is 75 nm to 200 nm. When the thickness is less than 50 nm, the function to protect against the environment, thermal resistance, and heat-accumulating property may be insufficient, when it is more than 250 nm, the delamination and/or cracks may be induced due to the increase of layer temperature at the step of forming the film by sputtering method, or the decrease of sensitivity may occur at recording.

The thickness of the second protective layer 4 may be properly selected depending on the application; preferably is 10 nm to 100 nm, more preferably is 15 nm to 50 nm. When the thickness is less than 10 nm, the thermal resistance is lower, when it is more than 100 nm, such matters may occur as the decrease of recording sensitivity, delamination and/or deformation of the layer due to the temperature rise, and the deterioration of repeated overwrite property due to the decrease of radiating function.

—Reflective Layer—

The reflective layer displays a performance as an optical reflective layer, and also acts as a radiating layer that dissipates the heat applied to the recording layer by irradiating laser light at recording. Since the formation of the amorphous mark remarkably depends on the cooling rate by the radiation, the selection of the reflective layer is particularly important in media for higher recording linear velocity.

The reflective layer 6 may be formed from metal material such as Al, Au, Ag, Cu, Ta and alloys thereof. Further, Cr, Ti, Si, Cu, Ag, Pd, Ta and the like are employed as the additive elements of the metal material. Among these, the reflective layer 6 preferably contains one of Ag and Ag alloys. The reason is that the reflective layer of the optical recording medium is usually preferred to be a metal material having higher thermal conductivity and higher reflectance from the viewpoint that the thermal conductivity relates to the adjustment of the cooling rate of the heat generated at recording, and the optical property relates to the improvement of the reproducing signal contrast by means of the interference effect, and pure Ag or Ag alloys have extremely high thermal conductivity such as 427 W/m·K in pure Ag, a rapid cooling construction may be achieved such that immediately after the recording layer reached a high temperature at recording, the temperature is cooled for forming amorphous marks.

From the viewpoint of higher thermal conductivity, pure Ag is most preferable; in addition, Cu may be added for improving the corrosion resistance. The content of Cu is preferably 0.1 to 10 atomic percent so as not to deteriorate the Ag or Ag Alloys property, more preferably is 0.5 to 3 atomic percent. Excessively high content may deteriorate the corrosion resistance.

As for the process for forming the first reflective layer 6, various vapor growth processes may be employed such as vacuum deposition, sputtering, plasma CVD, optical CVD, ion plating, electron beam deposition processes and the like. Among these, sputtering process is appropriate in mass production, film quality and the like.

Preferably, the thickness of the reflective layer is 100 nm to 300 nm. When the thickness is less than 100 nm, the cooling rare is inappropriately low since the radiating capacity of the reflecting layer is essentially proportional to the layer thickness. The thickness of more than 300 nm is not appropriate from the viewpoint of increased material cost.

Further, a protective resin layer may be provided on the reflective layer if necessary. The protective resin layer performs to protect the recording layer in the final product and also during the producing process. The protective layer is usually formed from UV-ray curable resin, and preferably has a thickness of 2 μm to 5 μm.

—Third Protective Layer—

Preferably, a barrier layer 5 that is substantially free from sulfur is provided between the protective layer and the reflective layer.

As for the material of the third protective layer 5, Si, SiC, SiN, GeN, $ZrO_2$ are exemplified. Among these, Si and SiC have higher barrier property and are preferable.

When Ag or Ag alloy is employed for the protective layer and a protective layer formed from a mixture of ZnS and $SiO_2$, i.e. which contains sulfur, is provided, a problem arises that sulfur diffuses into Ag, which results in a defect of disc (sulfide reaction of Ag). Accordingly, the third protective layer should satisfy the following requirements: (i) barrier property to prevent the sulfide reaction of Ag, (ii) optically transparent to laser light, (iii) lower thermal conductivity so as to form amorphous mark, (iv) high adhesion between the protective layer or the reflective layer, (v) facility for formation, and preferably a material based on Si or SiC is preferable for the material of the third protective layer that satisfies the requirement.

The thickness of the third protective layer is preferably 2 nm to 20 nm, more preferably 2 nm to 10 nm. When the thickness is less than 2 nm, the function as the barrier layer is insufficient, when more than 20 nm, the modulation level may be decreased.

The adhesive layer for adhering the substrate 1, into which information signals are written, and the substrate for laminating is formed from a double-sided sheet which is formed by coating an adhesive on both sides of base film, thermosetting resin, or UV-ray curable resin. The substrate for laminating or a dummy substrate is not necessary to be transparent when a tacky sheet or thermosetting resin is employed as the adhesive layer, the substrate transparent to UV-rays is employed when UV-ray curable resin is employed as the adhesive layer. Usually, the thickness of the substrate for laminating is substantially the same as the transparent substrate 1 into which information signals are written, i.e. of about 0.6 mm in thickness.

(Sputtering Target)

The sputtering target according to the present invention is utilized to prepare the recording layer, in the first aspect, has a composition expressed by the formula: $In_\alpha Sb_\beta$, wherein $\alpha$ and $\beta$ are atomic percent of the respective elements, $0.73 \leq \beta/(\alpha+\beta) \leq 0.90$, $\alpha+\beta=100$. The range of $\beta/(\alpha+\beta)$ is preferably $0.80 \leq \beta/(\alpha+\beta) \leq 0.90$.

The sputtering target according to the present invention is utilized to prepare the recording layer, in the second aspect, has a composition expressed by the formula: $M_\gamma In_\alpha Sb_\beta$, wherein M represents an element other than In and Sb or an element combination containing two or more elements other than In and Sb; $\alpha$ and $\beta$ are atomic percent of the respective elements, $\gamma$ is atomic percent of the element or sum of atomic percent of the respective elements; $0.73 \leq \beta/(\alpha+\beta) \leq 0.90$, $0 \leq \gamma \leq 20$, $0 < \gamma < \alpha$, $\alpha+\beta+\gamma=100$. The range of $\beta/(\alpha+\beta)$ is preferably $0.80 \leq \beta/(\alpha+\beta) \leq 0.90$.

Preferably, M in the recording layer is at least one element selected from the group consisting of Ge, Te, O, S, Se, Al, Ag, Mn, Cu, Au, and N; more preferably, M in the recording layer is Ge, and $0.2 \leq \gamma \leq 15$, alternatively, preferably M in the recording layer is Te, and $1 \leq \gamma \leq 15$.

The process for producing the sputtering target may be properly selected depending on the application, for example, the process may comprises weighing the pre-determined amount of specific raw materials, heating and melting them in a glass ample, then recovering the reaction product, and pulverizing it by milling device; then, the resulting powder is molded and sintered to prepare a disc-like sputtering target.

In accordance with the present invention, an optical recording medium may be provided that exhibits higher recording sensitivity even at 8 times or more of recording linear velocity than that of DVD-ROM i.e. 28 m/sec or more of recording linear velocity, while maintaining the same capacity, that is able to record repeatedly, and that display superior preservation reliability.

Further, in accordance with the present invention, an optical recording medium is provided that properly may afford repeatable recording property over wider region of recording linear velocity with similar capacity as DVD-ROM, and also a sputtering target may be provided for producing the optical recording medium.

(Process for Producing Optical Recording Medium)

The inventive process for producing an optical recording medium may produce an optical recording medium comprising a first protective layer, a recording layer, a second protective layer, and a reflective on a substrate in one of this sequence and the opposite sequence, wherein the inventive process comprises forming a recording layer, forming a crystallization-promoting layer, initially crystallizing, and the other steps depending on the requirements.

—Forming Recording Layer—

A recording layer is formed by a sputtering method using the sputtering target according to the present invention.

The sputtering method may be properly selected from the art depending on the application, preferably, Ar gas is utilized for the atmosphere of film forming, the input power is 1 kW to 5 kW, gas rate for film forming is 10 sccm to 40 sccm, and the Ar gas pressure in the sputtering chamber is $7.0 \times 10^{-3}$ mTorr or less, for example.

—Formation of Crystallization-Promoting Layer—

A crystallization-promoting layer is formed that contacts with at least a part of the recording layer.

The process for forming the crystallization-promoting layer may be properly selected depending on the application, for example, various vapor growth processes may be employed such as vacuum deposition, sputtering, plasma CVD, optical CVD, ion plating, electron beam deposition processes and the like. Among these, sputtering process is appropriate in mass production, film quality and the like.

—Initial Crystallization—

The optical recording medium is subjected to heating by means of laser beam to carry out the initial crystallization. The heating preferably leads to molten initial crystallization or solid phase initial crystallization.

Specifically, in the initial crystallization, while the optical recording medium is rotated at certain linear velocity or angle velocity, a recording light such as semiconductor laser is irradiated through an object glass from the substrate side. The recording layer absorbs the light and raises the temperature in spotted regions, then pits are formed for example thereby the optical property of the recording layer is altered, as a result information is recorded. Reproducing of the information recorded as such may be conducted by rotating the optical recording medium at a predetermined linear velocity, irradiating the laser light from the side of the first protective layer, and detecting the reflected light.

(Process for Using Optical Recording Medium)

The inventive process for using an optical recording medium comprises irradiating laser light onto the inventive optical recording medium from the side of the first protective layer, thereby conducting at least one of recording, reproducing, erasing, and rewriting of information. Preferably, the recording linear velocity of the optical recording medium is 28 m/sec or more.

Specifically, while the optical recording medium is rotated at certain linear velocity, a recording light such as semiconductor laser, e.g. 600 nm to 720 nm of radiating wavelength, is irradiated through an object glass from the substrate side. The recording layer absorbs the light and raises the temperature in spotted regions, then pits are formed for example thereby the optical property of the recording layer is altered, as a result information is recorded. Reproducing of the information recorded as such may be conducted by rotating the optical recording medium at a predetermined linear velocity, irradiating the laser light from the side of the first protective layer, and detecting the reflected light.

An optical information recording process for the optical recording media having higher velocity properties, in particular an example of recording strategy for the process will be explained with reference to FIG. 12.

In this description, the process will be explained in which information is recorded by modulating the length of marks and length between marks through applying PWM (Pulse Width Modulation) to optical recording media. The recording process can record information through controlling the length of recording marks and length between recording marks by employing basic clock period T as the unit. The recording process is characterized in the higher density since the recording density can be increased higher than the process of modulating mark sites that is a practical process for recording optical recording media; and is employed in modulating systems such as FEM for CD, DD (Double Density) and EFM+ for DVD. In the recording process of modulating the length of marks and length between marks, it is important to accurately control the length of marks and length between marks (hereinafter, referring to as "space length"). In these modulating systems, the length of recording marks and the length between recording marks are defined to be n×T (n: natural number of 3 or more, T: basic clock period) as the length in the traveling direction of laser light or periodical length. Accordingly, the length in the traveling direction of laser light is 0.4 μm or less.

In this example for explanation, but not limited to, recording is performed in a way that pulse numbers can be reduced so as to assure sufficient heating and cooling for higher speed recording with respect to the recording that utilizes three values of peak power Pp (=Pw), erasing power Pe, and bias power Pb; specifically, amorphous marks are formed each n×T in length by irradiating pulse light, of which the pulse number is (n/2+1) or less and integral and the irradiation is of repeated peak power Pp light and erasing power Pb light, and crystal spaces between the amorphous marks are formed each n×T in length by irradiating erasing power Pe. 3 T of 0.4 μm in length, which is the least mark formed by FEM+ modulation way, is obtained through 1 or 2 pulses. By properly establishing the values and the respective irradiating period of the peak power Pp, erasing power Pe, and bias power Pb, marks may be formed in predetermined length precisely. The pulse number mainly depends on the recording linear velocity; the higher is the recording linear velocity, the less pulse number is appropriate.

In altering from the formation of amorphous marks to the formation of crystal spaces under the higher velocity recording, the following recording strategies are appropriate: the irradiation is modulated from peak power light to erasing power light by way of bottom power light; alternatively, the irradiation is modulated directly from peak power light to erasing power light, then during the period after initiating the modulation to erasing power light and within the basic clock period T, at least one pulse of highly erasing power light Pe (h) of which energy is higher than the erasing power and lower than the peak power is irradiated, as the recording strategy. FIG. 12 shows an instance where the irradiation is modulated from peak power light to erasing power light by way of bottom power light.

Figure 13:
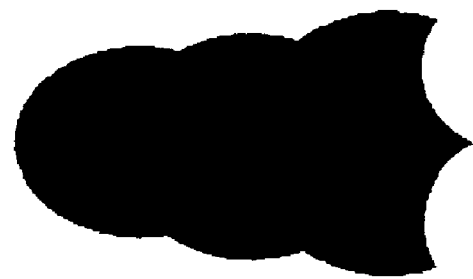
FIG. 13 exemplarily shows a view of mark that is recorded in accordance with the recording strategy of FIG. 12.

The erasing power light is not necessarily required to erase the previously recorded marks perfectly through irradiating at the recording linear velocity. As shown in FIG. 13, the marks are often broad in part rather than entirely even width. Typically, in many cases, marks are broader at their rear ends as shown in FIG. 13.

In the case that the crystallization progresses by the crystal growth from the boundary between the crystal phase, as the recording layer based on In—Sb-M, the temperature at the boundary between the crystal phase is a key factor.

FIG. 3 shows the relation between the crystal growth velocity and the temperature. The crystal growth velocity generally reaches a maximum at a temperature just below the melting point. Lower temperatures hardly prompt the crystal growth. When the boundary between the crystal phase does not rise to the temperature at which the crystal growth can progress rapidly i.e. near the melting point, the amorphous marks entirely remain without crystallizing. The condition is shown FIG. 14B.

Figure 14A:
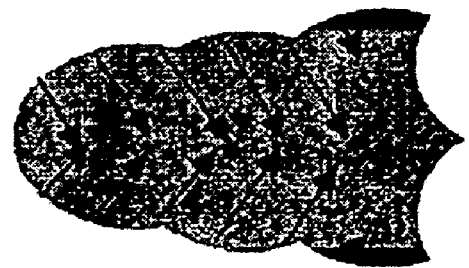
FIG. 14A is a view that schematically shows a partially remaining amorphous mark due to imperfect crystallization of the amorphous mark, and exemplarily explains the crystallizing condition when the erasing power at the amorphous mark is irradiated at a constant linear velocity.
Figure 14B:
FIG. 14B schematically shows the shape of remaining amorphous mark due to imperfect crystallization of the amorphous mark.

FIG. 14A exemplarily explains the crystallizing condition when the erasing power at the amorphous mark is irradiated at a constant linear velocity. The regions, at which the temperature is sufficiently high to progress the crystal growth in high velocity, are shown in light gray. If the boundary between the crystal and amorphous states exists within the region, crystallization progresses to the central portion owing to the higher crystallization rate; whereas if amorphous marks partially extend beyond the region due to the partially broad portions, amorphous marks remains in the shape exemplified by FIG. 14B owing to lower velocity of crystal growth. In order to prevent such incompletely erased marks, the temperature range at which crystal growth progresses rapidly should be extended by raising the level of erasing power light. Namely, the erasing power must be set higher, in order to erase entirely the amorphous marks containing partially broad portions.

However, when the recording velocity is higher, the erasing power set at higher level causes a problem that the jitter at the head of mark in particular comes to higher. The reason is considered as follows: in the higher recording velocity, the peak power light is irradiated for forming amorphous marks before the irradiation of the erasing power light brings about a stationary state for forming spaces; therefore, the temperatures come to uneven at irradiating the initial peak power light, resulting in uneven situations of the mark head portions. Since the variation of temperatures, at which initial peak power light is irradiated, is enlarged as the erasing power comes to higher, the jitter comes to more significant at the mark head portions. Further, the higher is the erasing power, the larger is the thermal load on the recording media; therefore, the film quality tends to be deteriorated under the repeated recordings and the durability under repeated recordings comes to inferior.

By the way, the erasing power light is not necessarily required to be high so that all of marks are erased. Pulse irradiation of higher erasing power light may erase the marks with partially broad portions, and may achieve proper repeated recordings without the effect on the durability under repeated recordings owing to lower thermal load. The timing for pulse irradiation of higher erasing power light is set within 1 T from initializing the irradiation of erasing power light. As a result, not only the previous marks may be erased at overwriting, but also the jitter at the rear end of marks may be reduced even at the first recording.

The irradiating period of higher erasing power per unit pulse is 0.2 T or more and 2 T or less. The period shorter than 0.2 T leads to insufficient heating, resulting in insufficient effect on erasing the marks with partially broad portions. The period longer than 2 T leads to substantially the same result as that of entirely higher erasing power, therefore, may cause the higher jitter at mark head or deterioration of the durability under repeated recordings.

Further, in the case that broader portions exist partially on the way to form a longer space, the higher erasing power pulse may not erase the portions by irradiating merely at the initial period of space forming; in order to address such a case, for example, the pulse number of higher erasing power may be added one for every space length increment of 3 T or more. For example, the pulse number may be increased one for the every increment of 3 T, 4 T, or 5 T, or in combination thereof. The way to increase the pulse number depends on the recording linear velocity and the feature of the recorded mark shape. By the way, one pulse is sufficient for forming the space of 3 T to 5 T; it should be noted that excessively large number of pulse might result in the deterioration of the durability under repeated recordings.

Preferably, the level of higher erasing power is 1.1 to 2.0 times that of the erasing power. The level of less than 1.1 times leads to insufficient heating, resulting in insufficient effect on erasing the marks with partially broad portions. The level of more than 2.0 times often leads to excessively high temperature, resulting in difficult control of mark length, deterioration of jitter, and the poor durability under repeated recordings. In addition, the higher erasing power should not exceed the heat power even when it is less than two times the erasing power.

(Optical Recording Apparatus)

The optical recording apparatus according to the present invention may perform at least one of recording, reproducing, erasing, and rewriting of information through irradiating light onto an optical recording medium, wherein the optical recording medium is one according to the present invention.

The optical recording apparatus may be properly constituted depending on the application, for example, from a laser source such as semiconductor laser configured to irradiate laser light, condensing lens configured to condense the laser light onto the optical recording medium mounted on a spindle, optical element configured to direct the laser light from the laser source to the condensing lens and detector for laser light, and detector for laser light configured to detect the reflected light of the laser light, and optional other units depending on the requirement.

The optical recording apparatus directs laser light from the laser source into the condensing lens by means of the optical element, and performs recording on the optical recording medium by condensing and irradiating the laser light onto the optical recording medium using the condensing lens. The optical recording apparatus directs the reflected laser light onto the laser light detector, and controls the light volume from laser source based on the detected laser amount by the laser detector.

The laser detector outputs the detected signals through transforming the detected laser light into voltage or current.

The optional other units described above include a controlling unit and the like. The controlling unit may be properly selected depending on the application, for example, is a sequencer or computer for irradiating and scanning the laser light modulated the intensity.

The present invention will be illustrated in more detailed with reference to examples given below, but these are not to be construed as limiting the present invention.

EXAMPLE 1

—Preparation of Optical Recording Medium—

A grooved polycarbonate resin substrate of 12 cm in diameter, 0.6 mm in thickness, and 0.74 µm in track pitch was prepared. The substrate was subjected to dehydration at a high temperature.

Then, a first protective layer in 65 nm thick was formed on the substrate by means of a sputtering method using a sputtering target of which the composition was $(ZnS)_{80}(SiO_2)_{20}$ as mole percent.

Then, a recording layer in 16 nm thick was formed on the first protective layer by means of a sputtering method at $3\times10^{-3}$ torr of argon gas pressure and 300 mW of RF power using a sputtering target of which the composition was $In_{17}Sb_{83}$ as atomic percent.

Then, a second protective layer in 10 nm thick was formed on the recording layer using the sputtering target of which the composition was $(ZnS)_{80}(SiO_2)_{20}$ as mole percent.

Then, a third protective layer in 4 nm thick was formed on the second protective layer using a SiC sputtering target.

Then, a radiating reflective layer in 120 nm thick was formed on the third protective layer using a pure silver sputtering target.

Then, an organic protective layer in 5 µm to 10 µm thick was formed on the reflective layer by coating a curable acryl resin by means of a spinner and curing by UV rays.

Finally, a polycarbonate resin substrate of 12 cm in diameter and 0.6 mm thick was laminated onto the organic protective layer using an adhesive; consequently, the optical recording medium of Example 1 was obtained.

<Initialization>

The resulting optical recording medium was subjected to initial crystallization of the recording layer through irradiating laser beam of 820 nm wavelength from a semiconductor laser (LD) having a larger diameter.

<Evaluation>

The recording and reproducing were carried out using a pickup of 656 nm in wavelength and NA 0.65. The data was recorded using optimum recording linear velocity and optimum recording power depending on each recording layer by means of EFM+ modulation. The recording strategy was respectively optimized so as to minimize the jitter. The reproducing was carried out at 0.7 mW of power and 3.5 m/sec of linear velocity; and data to clock jitter, degree of modulation, and reflectance were measured. Consequently, the linear velocity range capable of recording at 0.267 µm/bit as the recording bit length or recording density was as broad as 3.5 m/sec to 57 m/sec.

EXAMPLE 2

—Preparation of Optical Recording Medium—

An optical recording medium of Example 2 was prepared in the same manner as Example 1, except for changing the composition of recording layer into $(In_{0.13}Sb_{0.87})_{95}Ge_5$.

The optical recording medium was recorded in the same manner as Example 1; consequently, the linear velocity range capable of recording was as broad as 3.5 m/sec to 55 m/sec.

Further, the optical recording medium of Example 2 was evaluated as to the preservation reliability along with the recording medium of Example 1 under the condition of high temperature and high humidity, i.e. 80° C. and 85% Relative Humidity. Consequently, the recording medium of Example 1 increased 5% in the jitter property of recording mark after 300 hours, whereas the recording medium of Example 2 increased 1% or less. The results demonstrated that the addition of Ge is effective for improving the preservation reliability.

Further, it was confirmed that the addition of Ge is not clearly effective in a range of one or less atomic percent, and the linear velocity range capable of recording turns into lower along with increasing the added amount of Ge.

The content of Ge depends on the intended linear velocity. In general, the content is 0.1 or less as atomic ratio, i.e. 10 atomic percent or less, preferably, 0.07 or less as atomic ratio, i.e. 7 atomic percent or less.

EXAMPLE 3

—Preparation of Optical Recording Medium—

An optical recording medium of Example 3 was prepared in the same manner as Example 1, except for changing the composition of recording layer into $(In_{0.12}Sb_{0.88})_{90}Ge_5Al_5$.

The optical recording medium was recorded in the same manner as Example 1; consequently, the linear velocity range capable of recording was as broad as 3.5 m/sec to 58 m/sec. The linear velocity range capable of recording of Example 3 was broader than that of Example 2, which suggests that addition of Al is effective for enhancing linear velocity of recording. Further, the similar effect was also confirmed by adding Mg in place of Al.

Although the content of these elements depends on the intended linear velocity, the excessively large content may lead to mark crystallization even in reproducing light of lower power. Therefore, the content is preferably 0.15 or less as atomic ratio, i.e. 15 atomic percent or less, preferably, 0.1 or less as atomic ratio, i.e. 10 atomic percent or less. In addition, a preservation reliability test was made in a manner similar to that described in Example 2.

EXAMPLE 4

—Preparation of Optical Recording Medium—

An optical recording medium of Example 4 was prepared in the same manner as Example 1, except for changing the composition of recording layer into $(In_{0.12}Sb_{0.88})_{90}Ge_5Ag_5$.

The optical recording medium was recorded in the same manner as Example 1; consequently, the linear velocity range capable of recording was 3.5 m/sec to 54 m/sec, the similar modulation level with Example 2 was obtained even when the power of recording laser light was about 10% less than that of Example 2. Further, adding Cu, Au, or N in place of Ag also confirmed the similar effect.

The content of these elements depends on the intended linear velocity; an excessively large amount may lead to narrower linear velocity range capable of recording. In general, the content is 0.05 or less as atomic ratio, i.e. 5 atomic percent or less, preferably, 0.04 or less as atomic ratio, i.e. 4 atomic percent or less. In addition, a preservation reliability test was made in a manner similar to that described in Example 2.

EXAMPLE 5

—Preparation of Optical Recording Medium—

An optical recording medium of Example 5 was prepared in the same manner as Example 1, except for changing the composition of recording layer into $In_{25}Sb_{75}$.

The optical recording medium was recorded in the same manner as Example 1; consequently, the linear velocity range capable of recording was 3.5 to 54 m/sec. Also, a number of optical recording media were prepared and the reproducibility was evaluated; consequently, a part of media could be recorded only in a speed up to 8 times.

The results suggest that the limited crystallization rate of recording layer leads to insufficient high-speed recording property due to the altered properties of optical recording media derived from the alternation of film thickness of the first protective, recording, the second protective, radiating reflective layers and the like. In addition, a preservation reliability test was made in a manner similar to that described in Example 2.

EXAMPLE 6

—Preparation of Optical Recording Medium—

An optical recording medium of Example 6 was prepared in the same manner as Example 1, except for changing the composition of recording layer into $In_{22}Sb_{78}$.

The optical recording medium was recorded in the same manner as Example 1; consequently, the linear velocity range capable of recording was 3.5 m/sec to 54 m/sec. Also, a number of optical recording media were prepared and the reproducibility was evaluated; consequently, a part of media could be recorded only in a speed up to 8 times.

The results suggest that the limited crystallization rate of recording layer leads to insufficient high-speed recording property due to the altered properties of optical recording media derived from the alternation of film thickness of the first protective, recording, the second protective, radiating reflective layers and the like. In addition, a preservation reliability test was made in a manner similar to that described in Example 2.

COMPARATIVE EXAMPLE 1

—Preparation of Optical Recording Medium—

An optical recording medium of Comparative Example 1 was prepared in the same manner as Example 1, except for changing the composition of recording layer into $In_{30}Sb_{70}$.

The optical recording medium was recorded in the same manner as Example 1; consequently, the linear velocity range capable of recording was 3.5 to 28 m/sec, and the maximum recording velocity was only 8 times.

The reason is considered that the ratio of Sb to the sum of In and Sb: $\beta/(\alpha+\beta)$ is out of the range $0.73 \leq \beta/(\alpha+\beta) \leq 0.90$, therefore sufficient crystallization rate could not be attained. In addition, a preservation reliability test was made in a manner similar to that described in Example 2.

COMPARATIVE EXAMPLE 2

—Preparation of Optical Recording Medium—

An optical recording medium of Comparative Example 1 was prepared in the same manner as Example 1, except for changing the composition of recording layer into $In_8Sb_{92}$.

The resulting optical recording medium was subjected initialization in the same manner as Example 1. As the result, the reflectance nonuniformity was significant from the observation of RF signals by means of an oscilloscope; therefore, linear velocity, power, and feeding length were changed variously. However the conditions to suppress the reflectance nonuniformity could not be found. Further, the trials of recording could not attain the jitter of 20 percent or less even under various linear velocities. In addition, a preservation reliability test was made in a manner similar to that described in Example 2.

TABLE 1

| Recording Layer | | Linear Velocity (m/sec) | Jitter after Overwrite (%) | | Modulation after Overwrite (%) | | Preservation Reliability (%) | |
|---|---|---|---|---|---|---|---|---|
| | | | 1st | 1000th | 1st | 1000th | degree of Jitter | degree of Modulation |
| Ex. 1 | $In_{17}Sb_{83}$ | 3.5 | 8.3 | 9 | 69 | 63 | 13.3 | 60 |
| | | 17 | 8.1 | 8.9 | 68 | 62 | 13.0 | 60 |
| | | 28 | 7.7 | 8.8 | 69 | 62 | 13.0 | 60 |
| | | 57 | 8.1 | 8.9 | 67 | 61 | 13.1 | 60 |
| Ex. 2 | $(In_{0.13}Sb_{0.87})_{95}Ge_5$ | 3.5 | 8.2 | 8.8 | 67 | 62 | 8.9 | 62 |
| | | 17 | 8 | 8.8 | 66 | 62 | 8.7 | 61 |
| | | 28 | 7.8 | 8.9 | 66 | 63 | 8.4 | 62 |
| | | 55 | 7.6 | 9 | 65 | 61 | 8.6 | 60 |
| Ex. 3 | $(In_{0.12}Sb_{0.88})_{90}Ge_5Al_5$ | 3.5 | 8.2 | 8.8 | 68 | 63 | 8.5 | 66 |
| | | 17 | 8.3 | 8.9 | 67 | 62 | 8.4 | 65 |
| | | 28 | 8.0 | 8.8 | 67 | 61 | 8.1 | 64 |
| | | 58 | 8 | 9 | 66 | 61 | 8.4 | 61 |
| Ex. 4 | $(In_{0.12}Sb_{0.88})_{90}Ge_5Ag_5$ | 3.5 | 8.1 | 8.8 | 72 | 65 | 8.2 | 64 |
| | | 17 | 8 | 8.7 | 71 | 64 | 8 | 63 |
| | | 28 | 7.8 | 9 | 70 | 63 | 7.9 | 62 |
| | | 54 | 7.6 | 9 | 68 | 62 | 7.7 | 61 |
| Ex. 5 | $In_{25}Sb_{75}$ | 3.5 | 8.3 | 8.9 | 69 | 62 | 10.0 | 61 |
| | | 17 | 8.1 | 8.9 | 68 | 62 | 9.8 | 61 |
| | | 28 | 7.7 | 8.8 | 69 | 61 | 9.5 | 60 |
| | | 54 | 8.1 | 8.8-13 | 67 | 60 | 9.4 | 60 |
| Ex. 6 | $In_{22}Sb_{78}$ | 3.5 | 8.3 | 8.8 | 69 | 62 | 9.4 | 61 |
| | | 17 | 8.1 | 8.8 | 68 | 62 | 9.5 | 60 |
| | | 28 | 7.7 | 8.9 | 69 | 62 | 9.6 | 61 |
| | | 54 | 8.1 | 8.8-12 | 67 | 60 | 9.4 | 60 |
| Comp. Ex. 1 | $In_{30}Sb_{70}$ | 3.5 | 8.2 | 8.7 | 67 | 62 | 9.0 | 62 |
| | | 17 | 8.3 | 8.9 | 65 | 61 | 8.9 | 61 |
| | | 28 | 8.4 | 8.9 | 65 | 61 | 9.0 | 60 |
| | | 54 | 10 | 27 | 65 | 50 | 10.5 | 48 |
| Comp. Ex. 2 | $In_8Sb_{92}$ | 3.5 | 22 | (*) | 30 | 20 | (*) | 10 |
| | | 17 | 22 | (*) | 30 | 20 | (*) | 10 |
| | | 28 | 25 | (*) | 25 | 15 | (*) | (**) |
| | | 54 | 25 | (*) | 25 | 10 | (*) | (**) |

(*): Evaluation was impossible
(**): Measurements were impossible

EXAMPLE 7

—Preparation of Optical Recording Medium—

A grooved polycarbonate resin substrate of 12 cm in diameter, 0.6 mm in thickness, and 0.74 μm in track pitch was prepared. The substrate was subjected to dehydration at a high temperature.

Then, a first protective layer in 65 nm thick was formed on the substrate by means of a sputtering method using a sputtering target of which the composition was $(ZnS)_{80}(SiO_2)_{20}$ as mole percent.

Then, a boundary layer in 3 nm thick was formed on the first protective layer by means of a sputtering method using a sputtering target which was a mixture of $ZrO_2$, $Y_2O_3$, and $TiO_2$, wherein $ZrO_2/Y_2O_3=97/3$ as mole ratio, $(ZrO_2+Y_2O_3)/TiO_2=8/2$ as mole ratio.

Then, a recording layer in 16 nm thick was formed on the boundary layer by means of a sputtering method at $3\times10^{-3}$ torr of argon gas pressure and 300 mW of RF power using a sputtering target of which the composition was $In_{18}Sb_{82}$ as atomic percent.

Then, a second protective layer in 10 nm thick was formed on the recording layer using the sputtering target of which the composition was $(ZnS)_{80}(SiO_2)_{20}$ as mole percent.

Then, a third protective layer in 4 nm thick was formed on the second protective layer using a SiC sputtering target.

Then, a radiating reflective layer in 120 nm thick was formed on the third protective layer using a pure silver sputtering target.

Then, an organic protective layer in 5 μm to 10 μm thick was formed on the reflective layer by coating a curable acryl resin by means of a spinner and curing by UV rays.

Finally, a polycarbonate resin substrate of 12 cm in diameter and 0.6 mm in thickness was laminated onto the organic protective layer using an adhesive; consequently, the optical recording medium of Example 7 was obtained.

<Initialization>

The resulting optical recording medium was subjected to initial crystallization of the recording layer through irradiating laser beam of 820 nm wavelength from a semiconductor laser (LD) having a larger diameter.

<Evaluation>

The recording and reproducing were carried out using a pickup of 656 nm in wavelength and NA 0.65. The data was recorded using optimum recording linear velocity and optimum recording power depending on each recording layer by means of EFM+ modulation. The reproducing was carried out at 0.7 mW of power and 3.5 m/sec of linear velocity; and data clock jitter and reflectance were measured. Consequently, the linear velocity range capable of recording at 0.267 μm/bit as the recording bit length or recording density was as broad as 3.5 to 57 m/sec, and the jitter increased no more than 1% after repeated recordings of 1000 times.

EXAMPLE 8

—Preparation of Optical Recording Medium—

An optical recording medium of Example 8 was prepared in the same manner as Example 7, except for changing the composition of recording layer into $(In_{0.14}Sb_{0.86})_{95}Ge_5$.

The optical recording medium was recorded in the same manner as Example 7; consequently, the linear velocity range capable of recording was as broad as 3.5 m/sec to 55 m/sec.

Further, the optical recording medium of Example 8 was evaluated as to the preservation reliability along with the recording medium of Example 7 under the condition of high temperature and high humidity, i.e. 80° C. and 85% Relative Humidity. Consequently, the recording medium of Example 7 increased 2% in the jitter property of recording mark after 300 hours, whereas the recording medium of Example 8 increased 1% or less. The results demonstrated that the addition of Ge is effective for improving the preservation reliability.

Further, it was confirmed that the addition of Ge is not clearly effective in a range of one or less atomic percent, and the linear velocity range capable of recording turns into lower along with increasing the added amount of Ge.

The content of Ge depends on the intended linear velocity. In general, the content is 0.1 or less as atomic ratio, i.e. 10 atomic percent or less, preferably, 0.07 or less as atomic ratio, i.e. 7 atomic percent or less.

—Preparation of Optical Recording Medium—

EXAMPLE 9

An optical recording medium of Example 9 was prepared in the same manner as Example 8, except for changing the composition of boundary layer into $Al_2O_3$.

The optical recording medium of Example 9 was recorded in the same manner as Example 8 and evaluated as to the preservation reliability under the condition of high temperature and high humidity, i.e. 80° C. and 85% Relative Humidity. Consequently, the linear velocity range capable of recording and the preservation reliability were similar to those of Example 8.

EXAMPLE 10

—Preparation of Optical Recording Medium—

An optical recording medium of Example 10 was prepared in the same manner as Example 7, except for changing the composition of recording layer into $(In_{0.14}Sb_{0.86})_{90}Ge_5Al_5$.

The optical recording medium was recorded in the same manner as Example 7; consequently, the linear velocity range capable of recording was as broad as 3.5 m/sec to 58 m/sec. The linear velocity range capable of recording of Example 10 was broader than that of Example 8, which suggests that addition of Al is effective for enhancing linear velocity of recording. Further, the similar effect was also confirmed by adding Mn in place of Al.

Although the content of Al or Mn depends on the intended linear velocity, the excessively large content may lead to mark crystallization even in reproducing light having lower power. Therefore, the content is preferably 0.15 or less as atomic ratio, i.e. 15 atomic percent or less, preferably, 0.1 or less as atomic ratio, i.e. 10 atomic percent or less.

EXAMPLE 11

—Preparation of Optical Recording Medium—

A grooved polycarbonate resin substrate of 12 cm in diameter, 0.6 mm in thickness, and 0.74 μm in track pitch was prepared. The substrate was subjected to dehydration at a high temperature.

Then, a first protective layer in 65 nm thick was formed on the substrate by means of a sputtering method using a sputtering target of which the composition was $(ZnS)_{80}(SiO_2)_{20}$ as mole percent.

Then, a crystallization-promoting layer in 1 nm thick was formed on the first protective layer by means of a sputtering method using a sputtering target of Sb.

Then, a recording layer in 16 nm thick was formed on the crystallization-promoting layer by means of a sputtering method at $3\times10^{-3}$ torr of argon gas pressure and 300 mW of RF power using a sputtering target of which the composition was $In_{19}Sb_{81}$ as atomic percent.

Then, a second protective layer in 10 nm thick was formed on the recording layer using the sputtering target of which the composition was $(ZnS)_{80}(SiO_2)_{20}$ as mole percent.

Then, a third protective layer in 4 nm thick was formed on the second protective layer using a SiC sputtering target.

Then, a radiating reflective layer in 120 nm thick was formed on the third protective layer using a pure silver sputtering target.

Then, an organic protective layer in 5 μm to 10 μm thick was formed on the reflective layer by coating a curable acryl resin by means of a spinner and curing by UV rays.

Finally, a polycarbonate resin substrate of 12 cm in diameter and 0.6 mm in thickness was laminated onto the organic protective layer using an adhesive; consequently, the optical recording medium of Example 11 was obtained.

<Initialization>

The resulting optical recording medium was subjected to initial crystallization of the recording layer through irradiating laser beam of 820 nm wavelength from a semiconductor laser (LD) having a larger diameter.

<Evaluation>

The recording and reproducing were carried out using a pickup of 656 nm in wavelength and NA 0.65. The data was recorded using optimum recording linear velocity and optimum recording power depending on each recording layer by means of EFM+ modulation. The reproducing was carried out at 0.7 mW of power and 3.5 m/sec of linear velocity; and data clock jitter and reflectance were measured.

Consequently, the linear velocity range capable of recording at 0.267 μm/bit as the recording bit length or recording density was as broad as 3.5 m/sec to 55 m/sec, and the jitter increased no more than 1% after repeated recordings of 1000 times. Further, the optical recording medium of Example 11 was evaluated as to the preservation reliability under the condition of high temperature and high humidity, i.e. 80° C. and 85% Relative Humidity. Consequently, the jitter property of recording mark increased 2%, and the reflectance of the crystal decreased below 1%.

EXAMPLE 12

—Preparation of Optical Recording Medium—

An optical recording medium of Example 12 was prepared in the same manner as Example 11, except for changing the composition of crystallization-promoting layer into Bi. The initialization was not performed by the reason described later.

The optical recording medium was recorded in the same manner as Example 11; consequently, the linear velocity range capable of recording was as broad as 3.5 m/sec to 55 m/sec. Further, the optical recording medium of Example 11 was evaluated as to the preservation reliability under the condition of high temperature and high humidity, i.e. 80° C. and 85% Relative Humidity. Consequently, the jitter property of recording mark increased 2%, and the reflectance of the crystal decreased below 1%.

In addition, the recording layer of Example 12 was crystallized during forming the layer on the contrary to Example 11, therefore, the recording was possible without initialization step.

EXAMPLE 13

—Preparation of Optical Recording Medium—

An optical recording medium of Example 13 was prepared in the same manner as Example 11, except for changing the composition of crystallization-promoting layer into BiSb.

The optical recording medium was recorded in the same manner as Example 11; consequently, the linear velocity range capable of recording was as broad as 3.5 m/sec to 55 m/sec. Further, the optical recording medium of Example 13 was evaluated as to the preservation reliability under the condition of high temperature and high humidity, i.e. 80° C. and 85% Relative Humidity. Consequently, the jitter property of recording mark increased 2%, and the reflectance of the crystal decreased below 1%.

EXAMPLE 14

—Preparation of Optical Recording Medium—

An optical recording medium of Example 14 was prepared in the same manner as Example 11, except for changing the composition of recording layer into $(In_{0.15}Sb_{0.85})_{95}Ge_5$.

The optical recording medium was recorded in the same manner as Example 11; consequently, the linear velocity range capable of recording was as broad as 3.5 m/sec to 54 m/sec.

Further, the optical recording medium of Example 14 was evaluated along with the recording medium of Example 11 as to the preservation reliability under the condition of high temperature and high humidity, i.e. 80° C. and 85% Relative Humidity. Consequently, the jitter property of recording mark increased 2% in Example 11 after 300 hours, whereas the jitter property increased no more than 1% in Example 14, demonstrating that the addition of Ge is effective to improve the preservation reliability.

Further, it was confirmed that the addition of Ge is not clearly effective in a range of one atomic percent or less, and the linear velocity range capable of recording turns into lower along with increasing the added amount of Ge.

The content of Ge depends on the intended linear velocity. In general, the content is 0.1 or less as atomic ratio, i.e. 10 atomic percent or less, preferably, 0.07 or less as atomic ratio, i.e. 7 atomic percent or less.

EXAMPLE 15

—Preparation of Optical Recording Medium—

A grooved polycarbonate resin substrate of 12 cm in diameter, 0.6 mm in thickness, and 0.74 μm in track pitch was prepared. The substrate was subjected to dehydration at a high temperature.

Then, a first protective layer in 60 nm thick was formed on the substrate by means of a sputtering method using a sputtering target of which the composition was $(ZnS)_{80}(SiO_2)_{20}$ as mole percent.

Then, a recording layer in 14 nm thick was formed on the crystallization-promoting layer by means of a sputtering method at $3 \times 10^{-3}$ torr of argon gas pressure and 300 mW of RF power using a sputtering target of which the composition was $In_{19}Sb_{76}Te_5$ as atomic percent.

Then, a second protective layer in 10 nm thick was formed on the recording layer using the sputtering target of which the composition was $(ZnS)_{80}(SiO_2)_{20}$ as mole percent.

Then, a third protective layer in 4 nm thick was formed on the second protective layer using a SiC sputtering target.

Then, a radiating reflective layer in 140 nm thick was formed on the third protective layer using a pure silver sputtering target.

Then, an organic protective layer in 5 μm to 10 μm thick was formed on the reflective layer by coating a curable acryl resin by means of a spinner and curing by UV rays.

Finally, a polycarbonate resin substrate of 12 cm in diameter and 0.6 mm in thickness was laminated onto the organic protective layer using an adhesive; consequently, the optical recording medium of Example 15 was obtained.

<Initialization>

The resulting optical recording medium was subjected to initial crystallization of the recording layer through irradiating laser beam of 820 nm wavelength from a semiconductor laser (LD) having a larger diameter.

<Evaluation>

The recording was carried out using a pickup head of 656 nm in wavelength and NA 0.65 by means of EFM+ modulation and recording repeatedly random patterns of recording bit length 0.267 μm/bit at a velocity of 35 m/sec, which corresponds 10 times the velocity of DVD. The recording strategy was adjusted in a manner that 3 T was set as one pulse as for the number of pulse, which consisting of peak power and bias power at forming amorphous marks, and the pulse number in terms of 4 T or more was increased one by one at every 2 T increment of mark length. The pulse of power Pe (h) for highly erasing was not employed.

Figure 12:
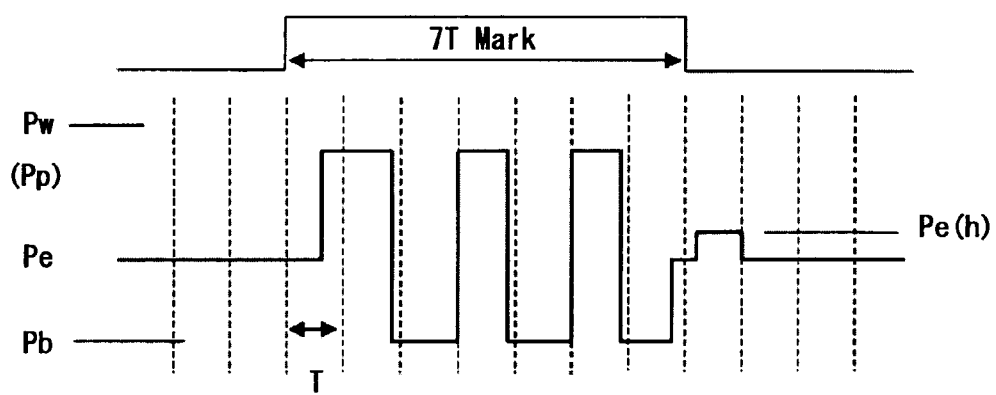
FIG. 12 schematically shows an optical information recording process, in particular the exemplary recording strategy, for recording the optical recording media according to the present invention.

FIG. 12 shows the power margin of DC (data to clock) jitter. The ratio ε of (erasing power/peak power) was adjusted to 0.23. Relatively proper recording properties were obtained at peak power of from 34 to 36 mW. DOW0, DOW1, DOW10, and DOW1000 refer respectively to direct overwrite of 0, 1, 10, and 1000 times.

The recording medium was stored at 80° C. for 300 hours, then the stabilities of recorded amorphous and crystal portions were examined with respect to archival and shelf properties respectively; consequently, both of the archival and shelf properties exhibited the jitter increases of no more than 1%, and the reflectance decreases were about 3%, demonstrating no actual problems.

EXAMPLE 16

—Preparation of Optical Recording Medium—

The optical recording medium same with Example 15 was subjected to recording with strategy using highly erasing power Pe (h). The ratio ε of (erasing power/peak power) was adjusted to 0.21, the highly erasing power was set by adding 1.5 mW to the erasing power, and the light was irradiated for 4 ns at the same time with modulating to the erasing power. From FIG. 13 that shows the power margin of DC jitter, it is understood that the jitter is entirely decreased compared to Example 1, and the repeatable recording property is improved in particular.

EXAMPLE 17

—Preparation of Optical Recording Medium—

An optical recording medium of Example 17 was prepared in the same manner as Example 15, except for changing the composition of recording layer into $Ag_1In_{19}Sb_{76}Te_4$.

The resulting optical recording medium was subjected to recording in the same manner as Example 16. In the RF signals observed by an oscilloscope after the initialization, it was confirmed that the reflectance nonuniformity was lowered compared to Example 15. From FIGS. 14A and B that shows the power margin of DC jitter, it is understood that the jitter at initial recording was improved in particular compared to Example 16.

The recording medium was stored at 80° C. for 300 hours, then the stabilities of recorded amorphous and crystal portions were examined with respect to archival and shelf properties respectively; consequently, both of the archival and shelf properties exhibited the jitter increases of no more than 1%, and the reflectance decreases were about 2.5%, demonstrating no actual problems.

EXAMPLE 18

—Preparation of Optical Recording Medium—

An optical recording medium of Example 18 was prepared in the same manner as Example 15, except for changing the composition of recording layer into $Ge_2In_{18}Sb_{76}Te_4$.

Figure 15:
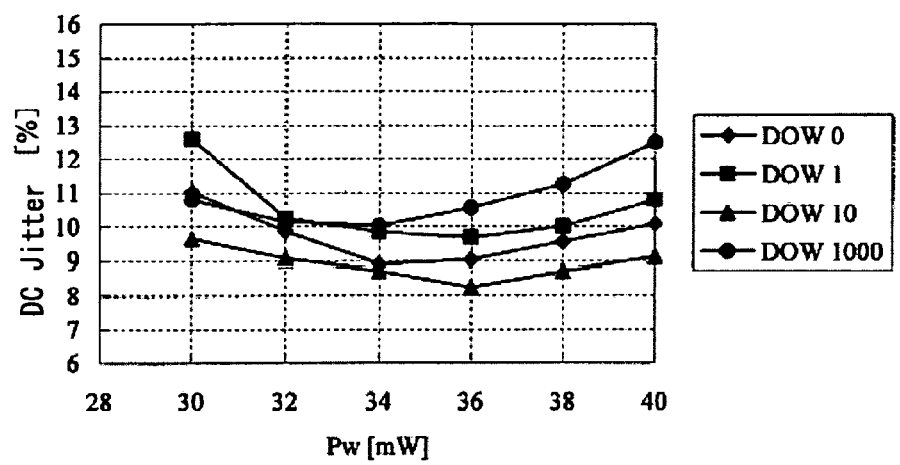
FIG. 15 is a graph that exemplarily shows a power margin of DC jitter of the optical recording medium obtained in Example 15.
Figure 16:
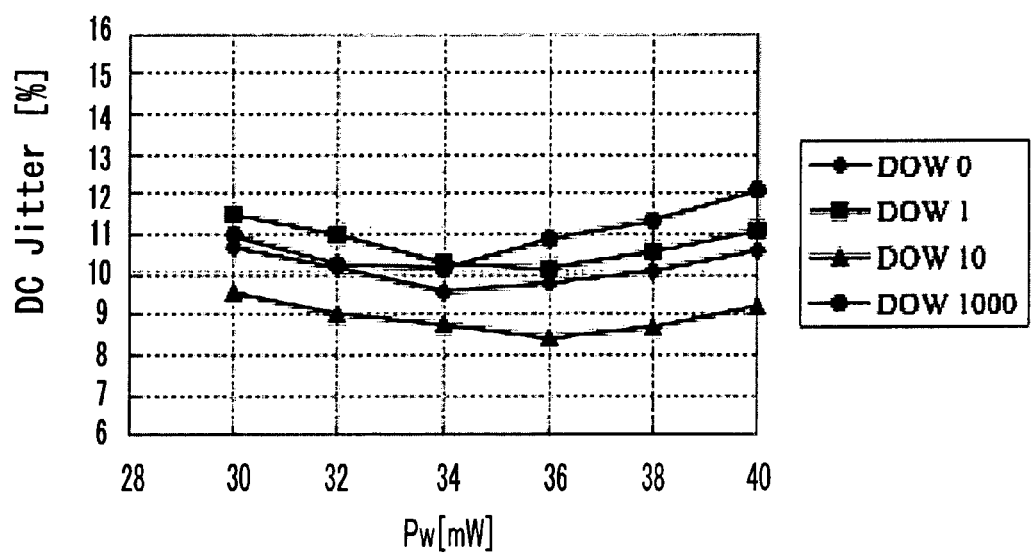
FIG. 16 is a graph that exemplarily shows a power margin of DC jitter of the optical recording medium obtained in Example 16.
Figure 17:
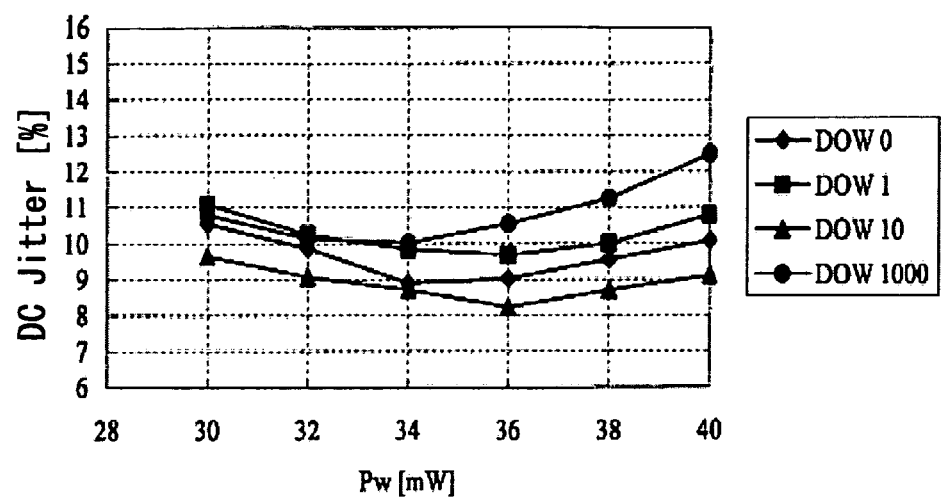
FIG. 17 is a graph that exemplarily shows a power margin of DC jitter of the optical recording medium obtained in Example 17.
Figure 18:
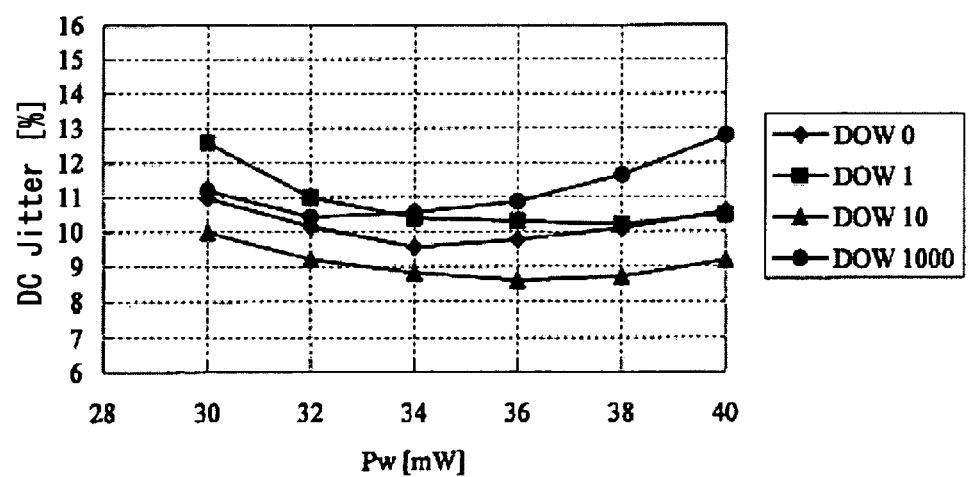
FIG. 18 is a graph that exemplarily shows a power margin of DC jitter of the optical recording medium obtained in Example 18.

The resulting optical recording medium was subjected to recording in the same manner as Example 16. The reflectance nonuniformity after the initialization was observed to be similar to that of Example 15. From FIG. 15 that shows the power margin of DC jitter, it is understood that recording was attained with the similar level to that of Example 16.

The recording medium was stored at 80° C. for 300 hours, then the stabilities of recorded amorphous and crystal portions were examined with respect to archival and shelf properties respectively; consequently, the rise of jitter in terms of the archival property was reduced to no more than 0.5%, and the reflectance decrease was about 3.5%, demonstrating no actual problems.

COMPARATIVE EXAMPLE 3

—Preparation of Optical Recording Medium—

An optical recording medium of Comparative Example 3 was prepared in the same manner as Example 15, except for changing the composition of recording layer into $In_{30}Sb_{70}$.

The resulting optical recording medium of Comparative Example 3 was subjected to initialization in the same manner as Example 16. The reflectance nonuniformity after the initialization was observed to be similar to that of Example 15, and the power margin of jitter was also similar to the level of Example 16.

The recording medium was stored at 80° C. for 300 hours, then the stabilities of recorded amorphous and crystal portions were examined with respect to archival and shelf properties respectively; consequently, the rise of jitter in terms of the archival property was as much as about 4%, the rise of jitter in terms of shelf property was as much as 10% or more, which is over the measurable range, and the reflectance decrease was as much as 9%. From the observation of mark shapes by means of TEM after the preservation test, it was confirmed that the mark shapes were almost the same as that of before the preservation test and the crystalline state of amorphous itself was stable. Accordingly, it is considered that the rise of jitter in terms of the archival property is not derived from the partial crystallization of amorphous marks, but derived from the transformation of crystal phase and the resulting significant change of reflectance.

COMPARATIVE EXAMPLE 4

—Preparation of Optical Recording Medium—

An optical recording medium of Comparative Example 4 was prepared in the same manner as Example 15, except for changing the composition of recording layer into $In_5Sb_{80}Te_{15}$.

The resulting optical recording medium of Comparative Example 4 was subjected to initialization in the same manner as Example 16. However, the reflectance nonuniformity of RF signals observed by an oscilloscope was remarkable; variously adjusting the linear velocity, power, and feeding width at the initialization could not reduce the nonuniformity. Recording was tried under various conditions; the jitter could be reduced only about 15% to 16% under an optimum various linear velocity.

As explained above, the optical recording medium according to the present invention may make possible to record reliably at a velocity of 8 times or more than that of DVD, i.e. 28 m/sec or more of recording linear velocity, while maintaining the same capacity with DVD-ROM, thus may be broadly applied to DVD optical recording media such as DVD-RAM, DVD-RW, DVD+RW and the like.

What is claimed is:

1. An optical recording medium comprising:
    a substrate, and
    a recording layer,
    wherein at least one of recording, reproducing, erasing, and rewriting of information is carried out by means of reversible phase changes at marks on the recording layer,
    the reversible phase changes at marks are induced between crystalline and amorphous states by laser irradiation,
    the length of the respective marks is 0.4 μm or less in the traveling direction of the laser irradiation, and
    the recording layer has a composition expressed by the formula: $In_\alpha Sb_\beta$, wherein α and β are atomic percent of the respective elements; $0.73 \leq \beta/(\alpha+\beta) \leq 0.90$, $\alpha+\beta=100$.

2. The optical recording medium according to claim 1, wherein the optical recording medium is able to record repeatedly at a linear velocity of 28 m/sec or more.

3. The optical recording medium according to claim 1, wherein the recording layer is crystallized at 150° C. to 250° C. in temperature increase of 10° C./minute.

4. The optical recording medium according to claim 1, wherein the thickness of the recording layer is 8 nm to 22 nm.

5. The optical recording medium according to claim 1, wherein the optical recording medium comprises a first protective layer, the recording layer, a second protective layer, and a reflective layer on the substrate in one of this sequence and the opposite sequence.

6. The optical recording medium according to claim 5, wherein a boundary layer containing an oxide is disposed at one of between the recording layer and the first protective layer, and between the recording layer and the second protective layer.

7. The optical recording medium according to claim 6, wherein the oxide is at least one selected from the group consisting of $ZrO_2$, $TiO_2$, $SiO_2$, $Al_2O_3$, $Ta_2O_5$, $Y_2O_3$, MgO, CaO, $Nb_2O_5$, and rare earth oxides.

8. The optical recording medium according to claim 6, wherein the thickness of the boundary layer is 1 nm to 20 nm.

9. The optical recording medium according to claim 1, wherein a crystallization-promoting layer is provided that contact with at least a part of the recording layer.

10. The optical recording medium according to claim 9, wherein the crystallization-promoting layer comprises one of Bi, Sb, Te, and In.

11. The optical recording medium according to claim 9, wherein the thickness of the crystallization-promoting layer is 0.2 nm to 10 nm.

12. The optical recording medium according to claim 5, wherein the reflective layer comprises one of Ag and Ag alloys.

13. The optical recording medium according to claim 5, wherein the second protective layer comprises a mixture of ZnS and $SiO_2$.

14. The optical recording medium according to claim 5, wherein the recording medium comprises a third protective layer between the second protective layer and the reflective layer, the third protective layer is substantially free from sulfur, and the third protective layer comprises one of SiC and Si.

15. The optical recording medium according to claim 14, wherein the thickness of the third protective layer is 2 nm to 10 nm.

16. An optical recording medium comprising:
a substrate, and
a recording layer,
wherein at least one of recording, reproducing, erasing, and rewriting of information is carried out by means of reversible phase changes at marks on the recording layer,
the reversible phase changes at marks are induced between crystalline and amorphous states by laser irradiation,
the length of the respective marks is 0.4 μm or less in the traveling direction of the laser irradiation, and
the recording layer has a composition expressed by the formula: $M_\gamma In_\alpha Sb_\beta$, wherein M represents an element other than In and Sb or an element combination containing two or more elements other than In and Sb; α and β are atomic percent of the respective elements, γ is atomic percent of the element or sum of atomic percent of the respective elements; $0.73 \leq \beta/(\alpha+\beta) \leq 0.90$, $0<\gamma<\alpha$, $\alpha+\beta+\gamma=100$.

17. The optical recording medium according to claim 16, wherein the optical recording medium is able to record repeatedly at a linear velocity of 28 m/sec or more.

18. The optical recording medium according to claim 16, wherein the M in the recording layer is at least one element selected from the group consisting of Ge, Te, O, S, Se, Al, Ag, Mn, Cu, Au, and N.

19. The optical recording medium according to claim 16, wherein the M in the recording layer is Ge, and $0.2 \leq \gamma \leq 15$.

20. The optical recording medium according to claim 16, wherein the M in the recording layer is Te, and $1 \leq \gamma \leq 15$.

21. The optical recording medium according to claim 16, wherein the recording layer is crystallized at 150° C. to 250° C. in temperature increase of 10° C./minute.

22. The optical recording medium according to claim 16, wherein the thickness of the recording layer is 8 nm to 22 nm.

23. The optical recording medium according to claim 16, wherein the optical recording medium comprises a first protective layer, the recording layer, a second protective layer, and a reflective layer on the substrate in one of this sequence and the opposite sequence.

24. The optical recording medium according to claim 23, wherein a boundary layer containing an oxide is disposed at one of between the recording layer and the first protective layer, and between the recording layer and the second protective layer.

25. The optical recording medium according to claim 24, wherein the oxide is at least one selected from the group consisting of $ZrO_2$, $TiO_2$, $SiO_2$, $Al_2O_3$, $Ta_2O_5$, $Y_2O_3$, MgO, CaO, $Nb_2O_5$, and rare earth oxides.

26. The optical recording medium according to claim 24, wherein the thickness of the boundary layer is 1 nm to 20 nm.

27. The optical recording medium according to claim 16, wherein a crystallization-promoting layer is provided that contact with at least a part of the recording layer.

28. The optical recording medium according to claim 27, wherein the crystallization-promoting layer comprises one of Bi, Sb, Te, and In.

29. The optical recording medium according to claim 27, wherein the thickness of the crystallization-promoting layer is 0.2 nm to 10 nm.

30. The optical recording medium according to claim 23, wherein the reflective layer comprises one of Ag and Ag alloys.

31. The optical recording medium according to claim 23, wherein the second protective layer comprises a mixture of ZnS and $SiO_2$.

32. The optical recording medium according to claim 23, wherein the recording medium comprises a third protective layer between the second protective layer and the reflective layer, the third protective layer is substantially free from sulfur, and the third protective layer comprises one of SiC and Si.

33. The optical recording medium according to claim 32, wherein the thickness of the third protective layer is 2 nm to 10 nm.

34. A sputtering target utilized to prepare a recording layer, wherein the sputtering target has a composition expressed by the formula: $In_\alpha Sb_\beta$, wherein α and β are atomic percent of the respective elements; $0.73 \leq \beta/(\alpha+\beta) \leq 0.90$, $\alpha+\beta=100$.

35. A sputtering target utilized to prepare a recording layer, wherein the sputtering target has a composition expressed by the formula: $M_\gamma In_\alpha Sb_\beta$, wherein M represents an element other than In and Sb or an element combination containing two or more elements other than In and Sb; $\alpha$ and $\beta$ are atomic percent of the respective elements, $\gamma$ is atomic percent of the element or sum of atomic percent of the respective elements; $0.73 \leq \beta/(\alpha+\beta) \leq 0.90$, $0<\gamma<\alpha$, $\alpha+\beta+\gamma=100$.

36. The sputtering target according to claim 35, wherein the M is at least one element selected from the group consisting of Ge, Te, O, S, Se, Al, Ag, Mn, Cu, Au, and N.

37. The sputtering target according to claim 35, wherein M is Ge, and $0.2 \leq \gamma \leq 15$.

38. The sputtering target according to claim 35, wherein M is Te, and $1 \leq \gamma \leq 15$.

39. A process for producing an optical recording medium, wherein the optical recording medium comprises a first protective layer, a recording layer, a second protective layer, and a reflective on a substrate in one of this sequence and the opposite sequence, the process comprising:
forming the recording layer by means of a sputtering method using a sputtering target that has a composition expressed by the formula: $In_\alpha Sb_\beta$, wherein $\alpha$ and $\beta$ are atomic percent of the respective elements; $0.73 \leq \beta/(\alpha+\beta) \leq 0.90$, $\alpha+\beta=100$.

40. The process for producing an optical recording medium according to claim 39, wherein the process comprises forming a crystallization-promoting layer that contacts at least a part of the recording layer.

41. The process for producing an optical recording medium according to claim 39, wherein the process further comprises heating the optical recording medium by means of laser light to cause initial crystallization.

42. The process for producing an optical recording medium according to claim 41, wherein the heating by means of laser light leads to one of molten initial crystallization and solid phase initialization.

43. A process for producing an optical recording medium, wherein the optical recording medium comprises a first protective layer, a recording layer, a second protective layer, and a reflective on a substrate in one of this sequence and the opposite sequence, the process comprising:
forming the recording layer by means of a sputtering method using a sputtering target that has a composition expressed by the formula: $M_\gamma In_\alpha Sb_\beta$, wherein M represents an element other than In and Sb or an element combination containing two or more elements other than In and Sb; $\alpha$ and $\beta$ are atomic percent of the respective elements, $\gamma$ is atomic percent of the element or sum of atomic percent of the respective elements; $0.73 \leq \beta/(\alpha+\beta) \leq 0.90$, $0<\gamma<\alpha$, $\alpha+\beta+\gamma=100$.

44. The process for producing an optical recording medium according to claim 43, wherein the process comprises forming a crystallization-promoting layer that contacts at least a part of the recording layer.

45. The process for producing an optical recording medium according to claim 43, wherein the process further comprises heating the optical recording medium by means of laser light to cause initial crystallization.

46. The process for producing an optical recording medium according to claim 45, wherein the heating by means of laser light leads to one of molten initial crystallization and solid phase initialization.

47. A process for using an optical recording medium, comprising irradiating laser light onto an optical recording medium, thereby conducting at least one of recording, reproducing, erasing, and rewriting of information,
wherein the optical recording medium comprises a protective layer, a recording layer, a second protective layer, and a reflective layer on a substrate in one of this sequence and the opposite sequence,
at least one of recording, reproducing, erasing, and rewriting of information is carried out by means of reversible phase changes at marks on the recording layer, the reversible phase changes at marks are induced between crystalline and amorphous states by laser irradiation,
the length of the respective marks is 0.4 μm or less in the traveling direction of the laser irradiation,
the recording layer has a composition expressed by the formula: $In_\alpha Sb_\beta$, wherein $\alpha$ and $\beta$ are atomic percent of the respective elements; $0.73 \leq \beta/(\alpha+\beta) \leq 0.90$, $\alpha+\beta=100$, and
wherein the irradiating laser light is conducted from the side of the first protective layer of the optical recording medium.

48. The process for using an optical recording medium according to claim 47, wherein the information is recorded depending on the length of marks in a condition that the length of amorphous marks in the traveling direction of the laser irradiation is expressed as n×T (n: natural number, T: basic clock period at recording).

49. The process for using an optical recording medium according to claim 47, wherein the crystalline portion of n×T in length is formed by repeated irradiation pulses of (n/2)+1 times, and the irradiation pulses are alternation of peak power irradiation with higher power level and bias power irradiation with lower power level.

50. A process for using an optical recording medium, comprising irradiating laser light onto an optical recording medium, thereby conducting at least one of recording, reproducing, erasing, and rewriting of information,
wherein the optical recording medium comprises a protective layer, a recording layer, a second protective layer, and a reflective layer on a substrate in one of this sequence and the opposite sequence,
at least one of recording, reproducing, erasing, and rewriting of information is carried out by means of reversible phase changes at marks on the recording layer, the reversible phase changes at marks are induced between crystalline and amorphous states by laser irradiation,
the length of the respective marks is 0.4 μm or less in the traveling direction of the laser irradiation,
the recording layer has a composition expressed by the formula: $M_\beta In_\alpha Sb_\beta$, wherein M represents an element other than In and Sb or an element combination containing two or more elements other than In and Sb; $\alpha$ and $\beta$ are atomic percent of the respective elements, $\gamma$ is atomic percent of the element or sum of atomic percent of the respective elements; $0.73 \leq \beta/(\alpha+\beta) \leq 0.90$, $0<\gamma<\alpha$, $\alpha+\beta+\gamma=100$, and
wherein the irradiating laser light is conducted from the side of the first protective layer of the optical recording medium.

51. The process for using an optical recording medium according to claim 50, wherein the information is recorded depending on the length of marks in a condition that the length of amorphous marks in the traveling direction of the laser irradiation is expressed as n×T (n: natural number, T: basic clock period at recording).

52. The process for using an optical recording medium according to claim 50, wherein the crystalline portion of n×T in length is formed by repeated irradiation pulses of (n/2)+1 times, and the irradiation pulses are alternation of peak power irradiation with higher power level and bias power irradiation with lower power level.

53. An optical recording apparatus for performing at least one of recording, reproducing, erasing, and rewriting of information through irradiating light onto an optical recording medium, wherein the optical recording medium comprises a substrate, and a recording layer, at least one of recording, reproducing, erasing, and rewriting of information is carried out by means of reversible phase changes at marks on the recording layer, the reversible phase changes at marks are induced between crystalline and amorphous states by laser irradiation, the length of the respective marks is 0.4 µm or less in the traveling direction of the laser irradiation, and the recording layer has a composition expressed by the formula: $In_\alpha Sb_\beta$, wherein $\alpha$ and $\beta$ are atomic percent of the respective elements; $0.73 \leq \beta/(\alpha+\beta) \leq 0.90$, $\alpha+\beta=100$.

54. An optical recording apparatus for performing at least one of recording, reproducing, erasing, and rewriting of information through irradiating light onto an optical recording medium, wherein the optical recording medium comprises a substrate, and a recording layer, at least one of recording, reproducing, erasing, and rewriting of information is carried out by means of reversible phase changes at marks on the recording layer, the reversible phase changes at marks are induced between crystalline and amorphous states by laser irradiation, the length of the respective marks is 0.4 µm or less in the traveling direction of the laser irradiation, and the recording layer has a composition expressed by the formula: $M_\gamma In_\alpha Sb_\beta$, wherein M represents an element other than In and Sb or an element combination containing two or more elements other than In and Sb; $\alpha$ and $\beta$ are atomic percent of the respective elements, $\gamma$ is atomic percent of the element or sum of atomic percent of the respective elements; $0.73 \leq \beta/(\alpha+\beta) \leq 0.90$, $0<\gamma<\alpha$, $\alpha+\beta+\gamma=100$.

* * * * *